United States Patent
Kamizuru et al.

(10) Patent No.: US 12,149,046 B2
(45) Date of Patent: Nov. 19, 2024

(54) LIGHT EMISSION DRIVE CIRCUIT AND LIGHT EMISSION DEVICE

(71) Applicant: Sony Semiconductor Solutions Corporation, Kanagawa (JP)

(72) Inventors: Hayato Kamizuru, Kagoshima (JP); Katsuhisa Daio, Kagoshima (JP); Hiroyuki Shoubu, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 820 days.

(21) Appl. No.: 17/294,220

(22) PCT Filed: Nov. 19, 2019

(86) PCT No.: PCT/JP2019/045253
§ 371 (c)(1),
(2) Date: May 14, 2021

(87) PCT Pub. No.: WO2020/129521
PCT Pub. Date: Jun. 25, 2020

(65) Prior Publication Data
US 2022/0013981 A1    Jan. 13, 2022

(30) Foreign Application Priority Data
Dec. 19, 2018 (JP) .................. 2018-236893

(51) Int. Cl.
*H01S 5/042* (2006.01)
*G01S 17/89* (2020.01)

(52) U.S. Cl.
CPC ............ *H01S 5/0427* (2013.01); *G01S 17/89* (2013.01)

(58) Field of Classification Search
USPC ...................................... 372/38.02
See application file for complete search history.

(56) References Cited

U.S. PATENT DOCUMENTS

| | | | |
|---|---|---|---|
| 4,584,477 A | 4/1986 | Yoshino | |
| 2003/0016711 A1* | 1/2003 | Crawford | H01S 5/042 372/38.02 |

(Continued)

FOREIGN PATENT DOCUMENTS

| | | |
|---|---|---|
| CN | 101083860 A | 12/2007 |
| CN | 103841722 A | 6/2014 |

(Continued)

OTHER PUBLICATIONS

International Search Report (PCT/ISA/210), International Application No. PCT/JP2019/045253, dated Jan. 10, 2020.

(Continued)

*Primary Examiner* — Tuan N Nguyen
(74) *Attorney, Agent, or Firm* — Michael Best & Friedrich LLP

(57) ABSTRACT

A configuration of a light emission device that shortens a light emission latency time of a light emitting element is simplified.
A light emission drive circuit includes a light emission current wire, a light emission current switch, a preliminary current wire, and a preliminary current switch. The light emission current wire flows a light emission current for causing a light emitting element to emit light, is the light emitting element. The light emission current switch is connected to the light emission current wire, and controls the light emission current. The preliminary current wire flows, in the light emission current wire, a preliminary current for exciting an inductance component of the light emission current wire before a light emission period being a period in which the light emission current flows in the light emitting element. The preliminary current switch is connected to the preliminary current wire, and controls the preliminary current.

18 Claims, 18 Drawing Sheets

(56) References Cited

U.S. PATENT DOCUMENTS

| | | |
|---|---|---|
| 2013/0258312 A1 | 10/2013 | Lewis |
| 2014/0139603 A1* | 5/2014 | Fujita .................. B41J 2/455 |
| | | 315/307 |
| 2017/0085057 A1 | 3/2017 | Barnes |

FOREIGN PATENT DOCUMENTS

| | | |
|---|---|---|
| EP | 2834667 A | 2/2015 |
| JP | 11-070699 A | 3/1999 |
| JP | 2004053250 A | 2/2004 |
| JP | 2014103320 A | 6/2014 |
| JP | 2015-103680 A | 6/2015 |
| JP | 2018-059839 A | 4/2018 |

OTHER PUBLICATIONS

Notification of Transmittal of the International Search Report and the Written Opinion of the International Searching Authority, or the Declaration (PCT/ISA/220), International Application No. PCT/JP2019/045253, dated Jan. 10, 2020.

Written Opinion of the International Search Authority (PCT/ISA/237), International Application No. PCT/JP2019/045253, dated Jan. 10, 2020.

* cited by examiner

LIGHT EMISSION DRIVE CIRCUIT AND LIGHT EMISSION DEVICE

TECHNICAL FIELD

The present disclosure relates to a light emission drive circuit and a light emission device. Specifically, the present disclosure relates to a light emission drive circuit and a light emission device that drive a light emitting element.

BACKGROUND ART

A distance measuring sensor that measures a distance to a subject before image capturing has been conventionally used in an imaging device or the like. The distance measuring sensor measures a distance to a subject by emitting light from a light source such as a laser diode onto a subject, and measuring a time until reflected light from the subject enters an imaging device. In a case where a distance to a moving subject is to be measured by the distance measuring sensor, it is necessary to drive the laser diode at high speed to emit light. This is for enhancing the detection accuracy of the distance. As a drive circuit that drives the laser diode at high speed, for example, a light source drive circuit that generates a predetermined current for obtaining a desired light amount of the laser diode, and first and second overshoot currents to be added to the predetermined current is used (for example, refer to Patent Document 1).

In the above-described conventional technology, by flowing an overshoot current with a current value larger than the predetermined current, a light emission latency time of the laser diode is shortened and the laser diode is driven at high speed. The above-described first overshoot current is an overshoot current for charging a parasitic capacitance of the laser diode. The first overshoot current is set to a predetermined current value. Furthermore, the second overshoot current is an overshoot current having a current value adjusted in accordance with response characteristics for compensating for a variation in light emission latency time that is attributed to a variation in response characteristics of the laser diode. The first and second overshoot currents are sequentially supplied to the laser diode, and the laser diode is driven.

CITATION LIST

Patent Document

Patent Document 1: Japanese Patent Application Laid-Open No. 2014-103320

SUMMARY OF THE INVENTION

Problems to be Solved by the Invention

In the above-described conventional technology, it is necessary to supply a plurality of overshoot currents to the laser diode, and the drive circuit accordingly becomes complicated, which is problematic.

The present disclosure has been devised in view of the above-described problematic point, and aims to simplify the configuration of a light emission device that shortens a light emission latency time of a light emitting element such as a laser diode.

Solutions to Problems

The present disclosure has been devised for solving the above-described problematic point, and the first aspect of the present disclosure is a light emission drive circuit including a light emission current wire configured to flow a light emission current for causing a light emitting element to emit light, in the light emitting element, a light emission current switch that is connected to the light emission current wire, and is configured to control the light emission current, a preliminary current wire configured to flow, in the light emission current wire, a preliminary current for exciting an inductance component of the light emission current wire before a light emission period being a period in which the light emission current flows in the light emitting element, and a preliminary current switch that is connected to the preliminary current wire, and is configured to control the preliminary current.

Furthermore, in the first aspect, the light emitting element may include a light emission chip that includes two electrodes arranged therein, and is configured to emit light in accordance with the light emission current flowing between the electrodes, two light emission current terminals for flowing the light emission current that are respectively arranged for the two electrodes, and a preliminary current terminal for flowing the preliminary current that is arranged on at least one of the two electrodes, the light emission current wire may be connected to the light emission current terminal, and the preliminary current wire may be connected to the preliminary current terminal.

Furthermore, in the first aspect, a bias circuit configured to supply a current substantially equal to a light emission threshold of the light emitting element, to the light emitting element as a bias current may be further included.

Furthermore, in the first aspect, the light emission current may be changed during the light emission period.

Furthermore, in the first aspect, the light emission current may be decreased during the light emission period.

Furthermore, in the first aspect, the light emitting element may include a laser diode.

Furthermore, in the first aspect, a power circuit configured to supply the light emission current may be further included.

Furthermore, in the first aspect, the power circuit may further supply the preliminary current.

Furthermore, in the first aspect, a power circuit configured to supply the preliminary current may be further included.

Furthermore, in the first aspect, a control unit configured to generate control signals of the light emission current switch and the preliminary current switch may be further included.

Furthermore, in the first aspect, the light emission current switch and the preliminary current switch may be formed by MOS transistors.

Furthermore, in the first aspect, a snubber circuit may be connected to at least one of the light emission current wire or the preliminary current wire.

Furthermore, the second of the present disclosure is a light emission device including a light emitting element, a light emission current wire configured to flow a light emission current for causing the light emitting element to emit light, in the light emitting element, a light emission current switch that is connected to the light emission current wire, and is configured to control the light emission current, a preliminary current wire configured to flow, in the light emission current wire, a preliminary current for exciting an inductance component of the light emission current wire before a light emission period being a period in which the light emission current flows in the light emitting element, and a preliminary current switch that is connected to the preliminary current wire, and is configured to control the preliminary current.

By employing the above-described aspects, an effect of flowing a preliminary current in a light emission current wire by arranging a preliminary current wire and a preliminary current switch, and exciting an inductance component of the light emission current wire is obtained. A configuration of a light emission device that shortens a latency time of light emission is expected to be simplified.

MODE FOR CARRYING OUT THE INVENTION

Figure 1:
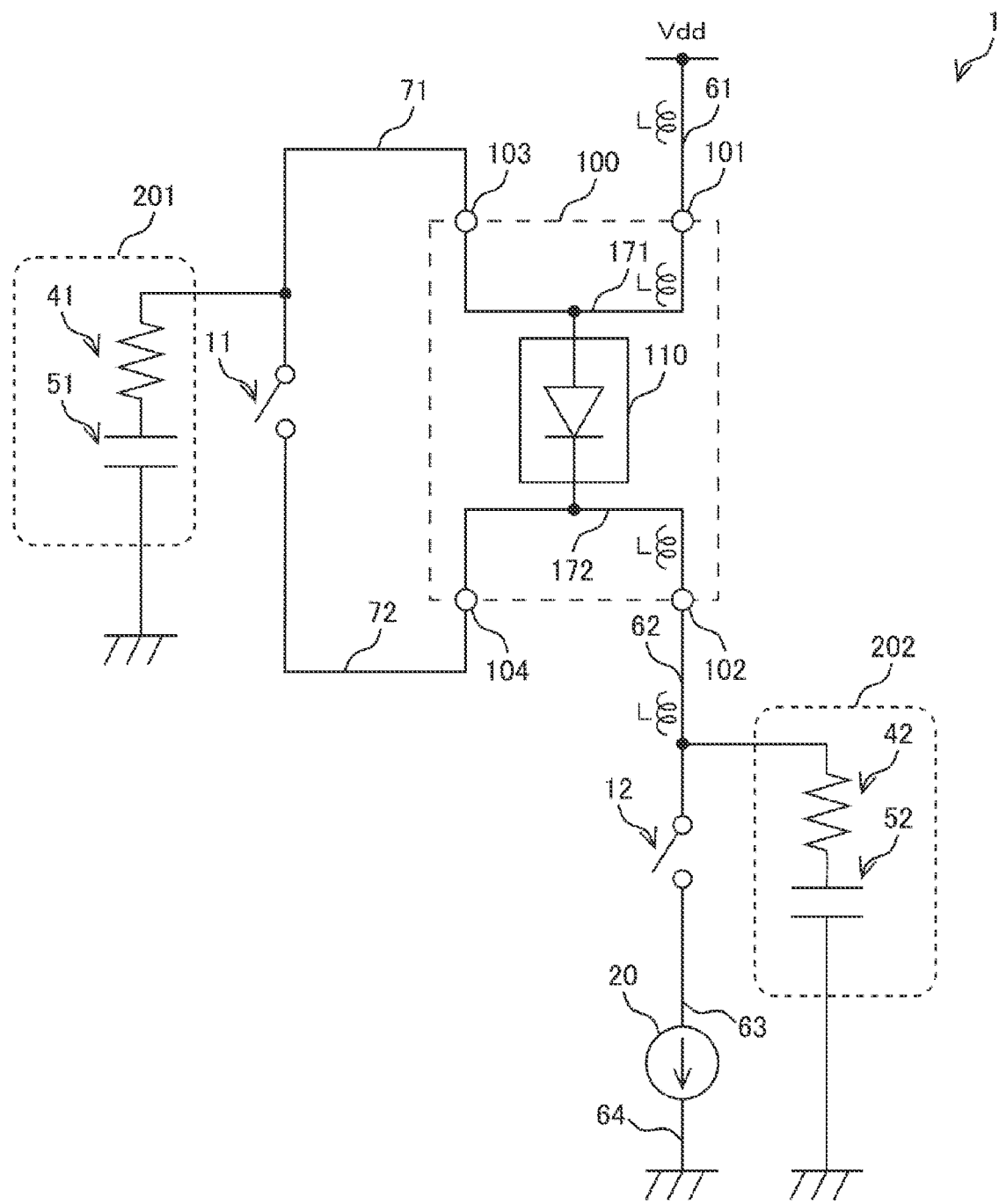
FIG. 1 is a diagram illustrating a configuration example of a light emission device according to a first embodiment of the present disclosure.

Next, modes for carrying out the present disclosure (hereinafter, referred to as embodiments) will be described with reference to the drawings. In the following drawings, the same or similar portions are assigned the same or similar reference numerals. Furthermore, embodiments will be described in the following order.
1. First Embodiment
2. Second Embodiment
3. Third Embodiment
4. Fourth Embodiment
5. Fifth Embodiment
6. Sixth Embodiment
7. Seventh Embodiment
8. Application Example to Camera 1. First Embodiment

[Configuration of Light Emission Device]

FIG. 1 is a diagram illustrating a configuration example of a light emission device according to the first embodiment of the present disclosure. The drawing is a circuit diagram illustrating a configuration example of a light emission device 1. The drawing is a diagram describing a principle of a light emission device of the present disclosure. The light emission device 1 is a light emission device used in a device that measures a distance to a subject using a time of flight (ToF) method in a camera or the like, for example. Here, the ToF method is a method of measuring a distance by emitting laser light onto a subject, and measuring a time taken for the laser light reciprocating between the device and the subject. The light emission device 1 in the drawing includes a light emitting element 100, a preliminary current switch 11, a light emission current switch 12, a constant current source 20, resistors 41 and 42, capacitors 51 and 52, wires 61 to 64 and 71 and 72, a power line Vdd, and a grounding wire. As described later, the light emitting element 100 includes terminals 101 to 104. The power line Vdd is a wire that supplies power of the light emission device 1. Furthermore, among circuits in the drawing, circuits other than the light emitting element 100 constitute a light emission drive circuit.

The terminal 101 of the light emitting element 100 is connected to the power line Vdd via the wire 61. The terminal 103 of the light emitting element 100 is connected to one end of the preliminary current switch 11 via the wire 71. Another end of the preliminary current switch 11 is connected to the terminal 104 of the light emitting element 100 via the wire 72. The terminal 102 of the light emitting element 100 is connected to one end of the light emission current switch 12 via the wire 62. Another end of the light emission current switch 12 is grounded via the wire 63, the constant current source 20, and the wire 64. The resistor 41 and the capacitor 51 connected in series are connected between the wire 71 and the grounding wire. The resistor 42 and the capacitor 52 connected in series are connected between the wire 62 and the grounding wire.

The light emitting element 100 is an element that includes a semiconductor chip and emits light by flowing a current. The light emitting element 100 in the drawing has a configuration in which a light emission chip 110 formed on the semiconductor chip is sealed in a semiconductor package. The semiconductor package includes the terminals 101 to 104. For example, a laser diode or a light emitting diode can be applied to the light emission chip 110. In the light emission device 1 in the drawing, the light emission chip 110 including a laser diode is assumed. The laser diode is a diode that emits laser light by flowing a current from an anode to a cathode. As illustrated in the drawing, an anode of the light emission chip 110 is connected to the terminals 101 and 103 via a wire 171. Furthermore, a cathode of the light emission chip 110 is connected to the terminals 102 and 104 via a wire 172. Note that a current for causing the light emitting element 100 to emit light will be referred to as a light emission current.

The preliminary current switch 11 and the light emission current switch 12 are elements reversibly transitioning to two states including a conductive state and a nonconductive state. The state transition is controlled in accordance with a control signal input to a control terminal (not illustrated). A semiconductor element such as, for example, a NOS transistor can be used as the preliminary current switch 11 and the light emission current switch 12.

The resistor 41 and the capacitor 51 connected in series constitute a snubber circuit 201, and the resistor 42 and the capacitor 52 connected in series constitute a snubber circuit 202. The snubber circuits 201 and 202 are circuits for suppressing ringing of a light emission current that is generated when a switch element transitions from the conductive state to the nonconductive state, and when a switch element transitions from the nonconductive state to the conductive state. The ringing is generated by a vibrational current flowing between an inductance component of a wire or the like, and a parasitic capacitance or the like of a switch element. If a light emission current vibrates, a light amount of the light emitting element 100 varies, and the accuracy declines when the light emission device 1 is used in a distance measuring sensor or the like. By arranging the snubber circuits 201 and 202, it is possible to suppress ringing and reduce a decline in accuracy of a distance measuring sensor or the like. The snubber circuit 201 is connected to a preliminary current wire, which will be described later, and the grounding wire being a low-impedance node. Furthermore, the snubber circuit 202 is connected between a light emission current wire and the grounding wire. Note that the configuration of the light emission device 1 is not limited to this example. For example, either one of the snubber circuits 201 and 202 may be arranged.

The constant current source 20 is a circuit that flows a constant current in the light emitting element 100. By the constant current source 20, a predetermined light emission current can be flowed in the light emitting element 100. Specifically, the constant current source 20 restricts a current flowing in the light emitting element 100, to a current with a predetermined value, on the basis of a source voltage supplied from the power line Vdd. A circuit formed by a bipolar transistor having a base driven to a constant voltage, for example, can be used as the constant current source 20. Note that the constant current source 20 and the power line Vdd serve as an example of a power circuit described in the appended claims.

The driving of a light emitting element in the light emission device 1 can be performed in the following manner. First of all, the light emission current switch 12 is controlled from the outside, and the light emission current switch 12 is caused to transition from the nonconductive state to the conductive state. Then, a closed circuit is formed by the wires 61 to 64, the wires 171 and 172, and the constant current source 20, and a light emission current flows from the power line Vdd to the grounding wire through the light emission chip 110. As described above, the light emission current is a current having the maximum value set by the constant current source 20. By setting the light emission current to a value exceeding a light emission threshold of the light emission chip 110, laser light can be emitted from the light emission chip 110. A period during which the light emitting element 100 emits light will be referred to as a light emission period. The light emission period corresponds to a period in which a light emission current flows in the light emitting element 100.

However, because the wires 61 to 64 and the wires 171 and 172 have an inductance component (parasitic inductance L) as illustrated in the drawing, a rising waveform of the light emission car rent becomes dull. In other words, a time taken for reaching a predetermined light emission current from the transition of the light emission current switch 12 to the conductive state becomes longer. Thus, light emission of the light emission chip 110 is delayed, and the delay disturbs high-speed driving of the light emitting element 100.

In view of the foregoing, in the light emission device 1 in the drawing, arranging the preliminary current switch 11, a preliminary current is flowed in the light emission chip 110, and rising of a light emission current is made faster. Here, the preliminary current is a current preliminarily flowed in the wires 61 and 62 and the like that serve as a path for flowing a light emission current in the light emitting element 100, before the light emission period. By flowing the preliminary current in the wires 61 to 64 and the wires 171 and 172 precedential to the light emission period, parasitic inductances of these wires can be excited. Specifically, before the light emission period, the light emission current switch 12 and the preliminary current switch 11 are caused to transition to the conductive state. Therefore, a preliminary current flows from the power line Vdd through a path including the wire 61, the wire 171, the wire 71, the preliminary current switch 11, the wire 72, the wire 172, the wire 62, the light emission current switch 12, the wire 63, the constant current source 20, the wire 64, and the grounding wire.

After the wires 61 and 62 and the like are excited by the preliminary current and a value of the preliminary current reaches a value of a light emission current, the preliminary current switch 11 is caused to transition to the nonconductive state. A current that had been flowing by being diverted from the light emission chip 110 flows in the light emission chip 110, and the light emission chip 110 emits light. Because the parasitic inductances of the wires 61 and 62 and the like are already excited, a light emission current with steep rising can be flowed in the light emission chip 110.

Note that the wires 61 to 64 serve as an example of a light emission current wire described in the appended claims. The wires 71 and 72 serve as an example of a preliminary current wire described in the appended claims. The terminals 101 and 102 serve as an example of a light emission current terminal described in the appended claims. The terminals 103 and 104 serve as an example of a preliminary current terminal described in the appended claims. Note that, in the example in the drawing, in the wire 171 in the light emitting element 100, a wire between the terminal 101 and an anode of the light emission chip 110 can be regarded as a light emission current wire, and a wire between the terminal 103 and the anode of the light emission chip 110 can be regarded as a preliminary current wire. In a similar manner, in the wire 172, a wire between the terminal 102 and a cathode of the light emission chip 110 can be regarded as a light emission current wire, and a wire between the terminal 104 and the cathode of the light emission chip 110 can be regarded as a preliminary current wire.

[Driving Method of Light Emitting Element]

Figure 2:
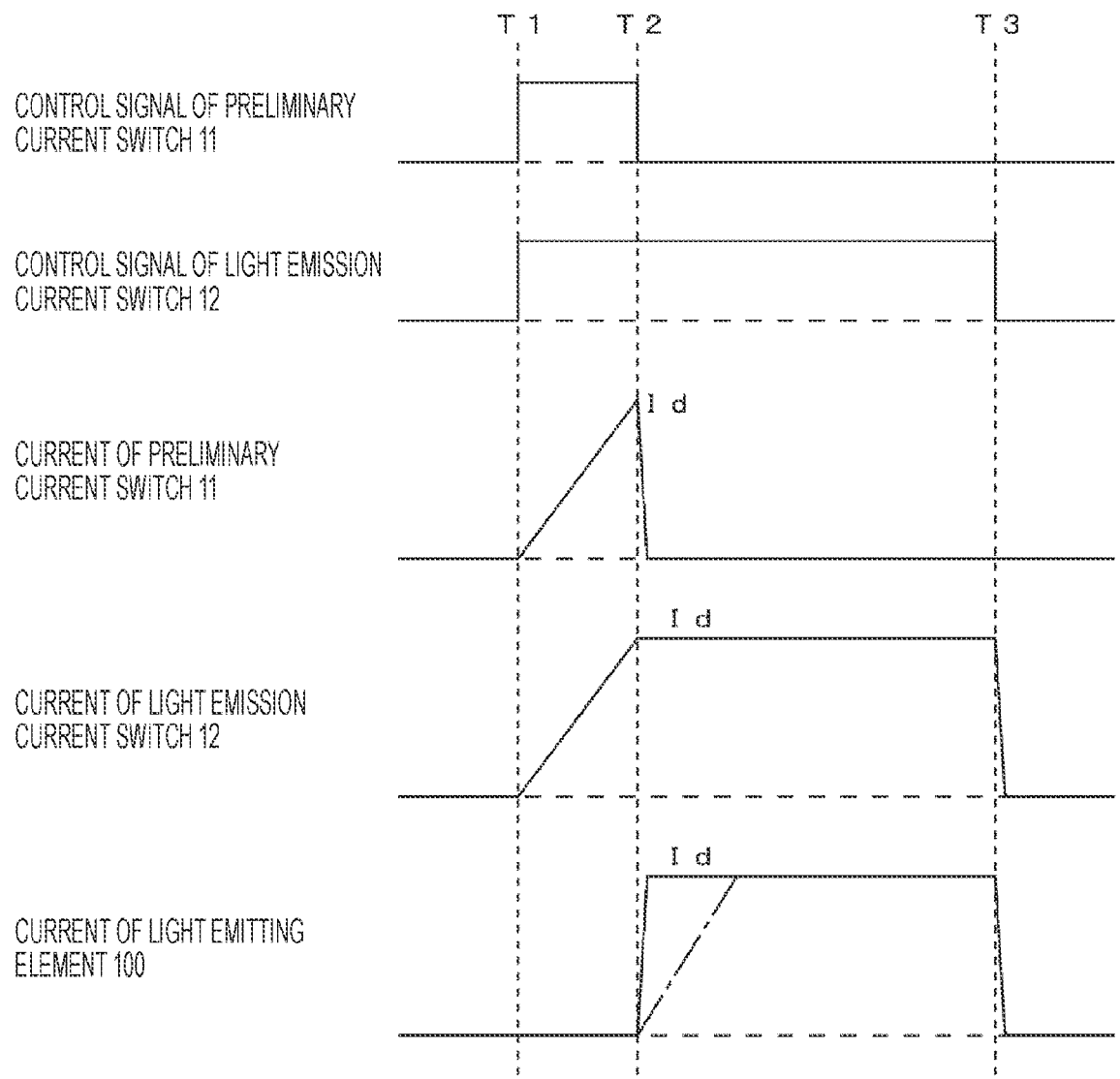
FIG. 2 is a diagram illustrating an example of a driving method of the light emission device according to the first embodiment of the present disclosure.

FIG. 2 is a diagram illustrating an example of a driving method of the light emission device according to the first embodiment of the present disclosure. The drawing is a diagram illustrating a relationship between control signals of the preliminary current switch 11 and the light emission current switch 12, and currents of the preliminary current switch 11, the light emission current switch 12, and the light emitting element 100. The control signal of the preliminary current switch 11 and the control signal of the light emission current switch 12 are represented by binarizing control signals applied to gates of semiconductor elements such as MOS transistors, for example, that are to be used as the preliminary current switch 11 and the light emission current switch 12. In the drawing, when values of the control signals of the preliminary current switch 11 and the light emission current switch 12 are "1", voltages for electrically connecting between sources and drains of the MOS transistors are applied to between gates and sources. The signal will be hereinafter referred to as an ON signal. Furthermore, in the waveform in the drawing, a dotted line indicates a line of 0 V or 0 A.

At T1, ON signals are applied to the preliminary current switch 11 and the light emission current switch 12. Therefore, the preliminary current switch 11 and the light emission current switch 12 transition to the conductive state. A source voltage from the power line Vdd is applied to parasitic inductances of the wires 61 to 64 and the like, and a preliminary current corresponding to an excitation current of the parasitic inductances starts to flow in the wires 61 to 64 and the wires 71 and 72. As illustrated as the current of the preliminary current switch 11 and the current of the light emission current switch 12 in the drawing, the preliminary current increases like a ramp function.

At T2, the application of the ON signal to the preliminary current switch 11 is stopped, and the preliminary current switch 11 is caused to transition to the nonconductive state. On the other hand, the light emission current switch 12 continues to be in the conductive state. At this time, a flow path of a current Id that had been flowing in the preliminary current switch 11 changes to the light emitting element 100, and continues to flow via the light emission current switch 12. The current Id flowing in the light emitting element 100 and the light emission current switch 12 becomes a light emission current for obtaining a desired light amount in the light emitting element 100. In other words, a period from T1 to T2 corresponds to a period in which the preliminary current increases to a value equivalent to the light emission current. The current Id in the light emission current can be set to a current set by the constant current source 20. When the preliminary current switch 11 transitions to the nonconductive state, back electromotive force is generated by parasitic inductances of the wires 61 and 62 and the like, and an overvoltage is applied to the light emission chip 110. By the overvoltage, a rising time of a current flowing in the light emission chip 110 can be further shortened. This is because a charging time of the parasitic capacitance of the light emission chip 110 can be shortened.

At T3, the application of the ON signal to the light emission current switch 12 is stopped. Therefore, the light emission current switch 12 transitions to the nonconductive state, a light emission current flowing in the light emitting element 100 is blocked, and emission of laser light from the light emitting element 100 stops. A period from T2 to T3 corresponds to a light emission period.

As illustrated in the drawing, at the beginning of the light emission period, rising of a current flowing in the light emitting element 100 can be made steep, and a latency time until light emission of the light emitting element 100 can be shortened. A dashed-dotted line in the waveform of the current flowing in the light emitting element 100 in the drawing indicates a waveform of a current that flows in a case where the ON signal is applied to the light emission current switch 12 at T2 without flowing the preliminary current. Due to the influence of parasitic inductances of the wires 61 and 62 and the like, a rising time of the light emission current becomes longer, and a light emission latency time of the light emitting element 100 becomes longer. Furthermore, a period during which the light emission current with the value Id flows in the light emission period becomes shorter.

As described above, the light emission device 1 according to the first embodiment of the present disclosure excites the parasitic inductances of the wires 61 to 64 before the light emission period by flowing the preliminary current in the wires 61 to 64 in which a light emission current of the light emitting element 100 is to be flowed. Therefore, a rising time of the light emission current that flows in the light emitting element 100 in the light emission period can be shortened. The preliminary current can be flowed by connecting the preliminary current switch 11 and the accompanying wires 71 and 72, and the configuration of the light emission device 1 can be simplified.

2. Second Embodiment

The light emission device 1 according to the above-described first embodiment uses the light emitting element 100 formed in a package including four terminals. In contrast to this, a light emission device 1 according to the second embodiment of the present disclosure differs from the above-described first embodiment in that a light emitting element including two terminals is used.

[Configuration of Light Emission Device]

Figure 3:
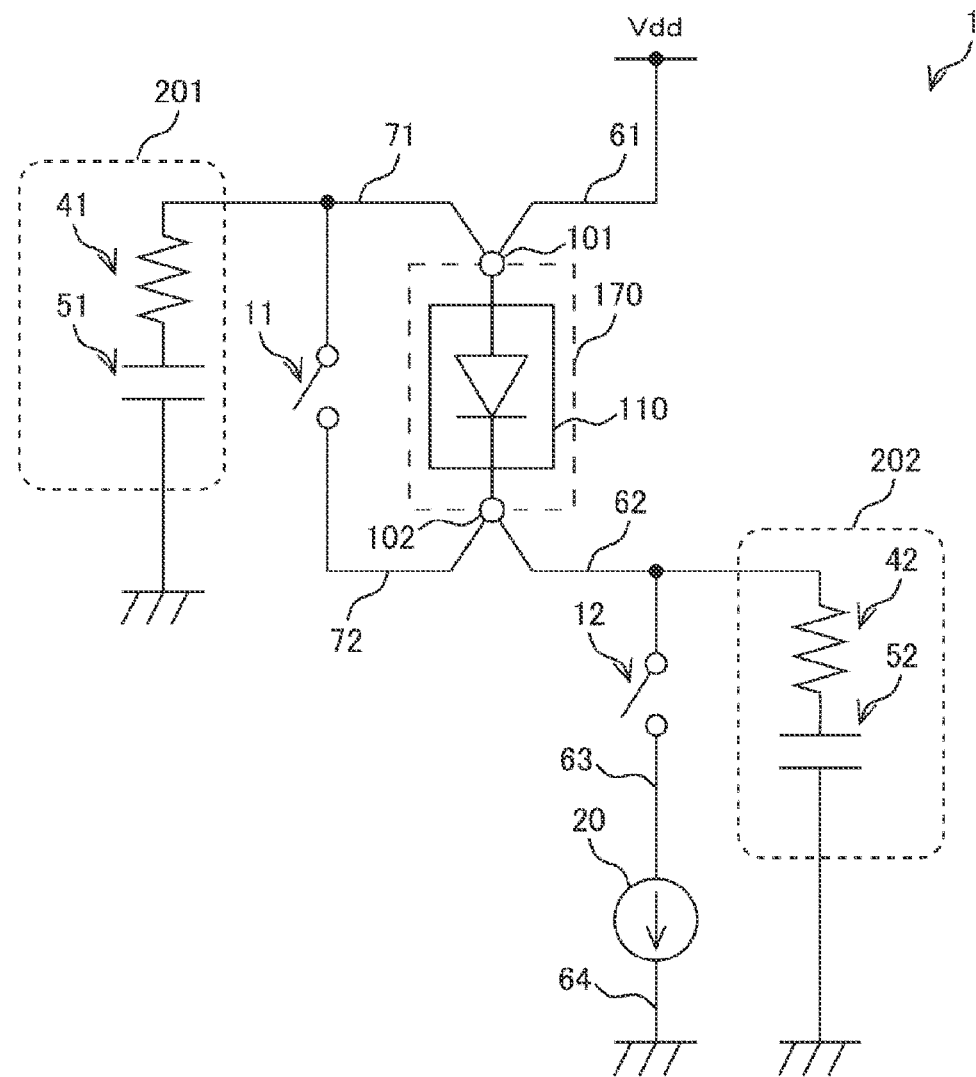
FIG. 3 is a diagram illustrating a configuration example of a light emission device according to a second embodiment of the present disclosure.

FIG. 3 is a diagram illustrating a configuration example of a light emission device according to the second embodiment of the present disclosure. Similarly to FIG. 1, the drawing is a circuit diagram illustrating a configuration example of the light emission device 1. The light emission device 1 in the drawing differs from the light emission device 1 described with reference to FIG. 1, in that a light emitting element 170 is used in place of the light emitting element 100.

The light emitting element 170 includes terminals 101 and 102. Wires 61 and 71 are connected in common to the terminal 101, and wires 62 and 72 are connected in common to the terminal 102. Because the wire connection other than this is similar to that in FIG. 1, the description will be omitted.

The light emitting element 170 is a light emitting element including the light emission chip 110, and formed in a semiconductor package including two terminals. An anode and a cathode of the light emission chip 110 are respectively connected to the terminals 101 and 102.

[Configuration of Light Emitting Element]

Figure 4:
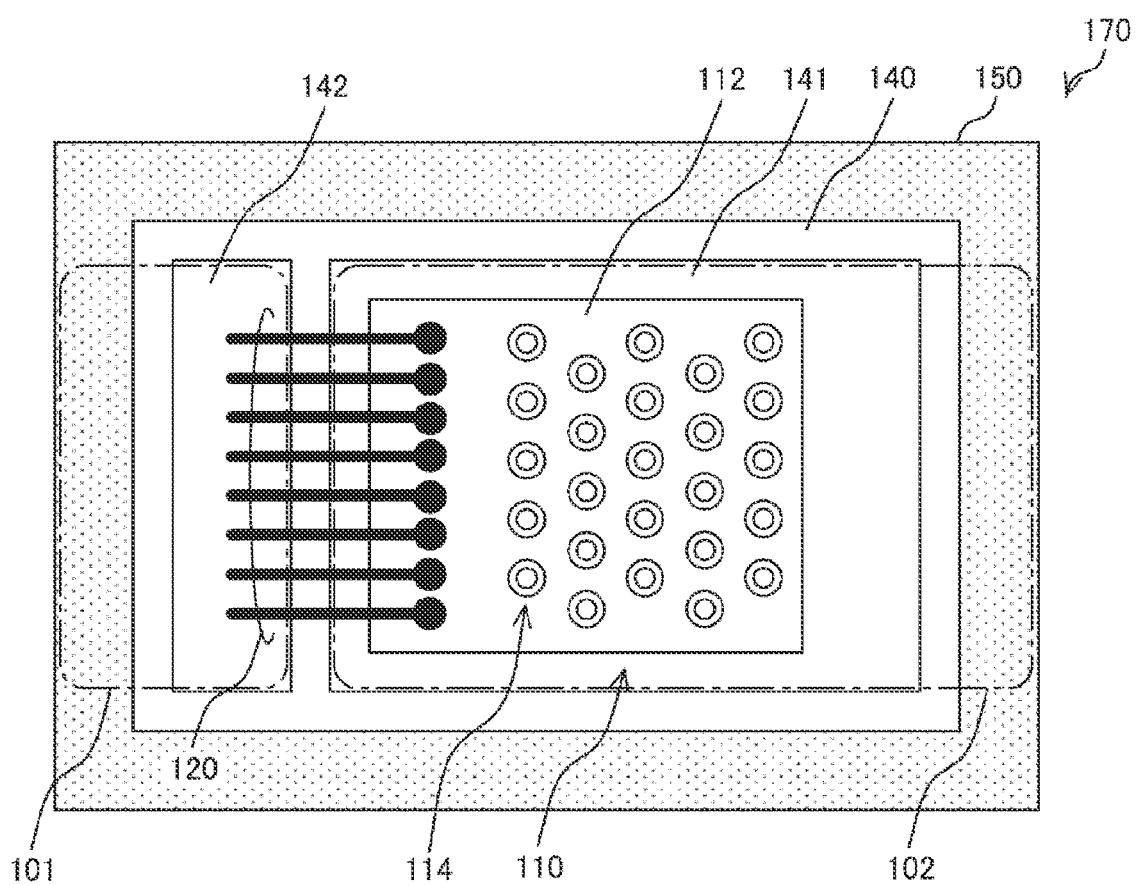
FIG. 4 is a plan view illustrating a configuration example of a light emitting element according to the second embodiment of the present disclosure.

FIG. 4 is a plan view illustrating a configuration example of a light emitting element according to the second embodiment of the present disclosure. The drawing is a plan view illustrating a configuration example of the light emitting element 170. The light emitting element 170 in the drawing includes the light emission chip 110, a frame 150, a diffuser panel 160 (not illustrated), a substrate 140, bonding wires 120, and a solder 130 (not illustrated).

The light emission chip 110 is a light emitting element including a plurality of vertical cavity surface emitting lasers (VCSELs) formed on a semiconductor substrate, and is a surface emitting laser element that emits laser light in a vertical direction. Circles on the surface of the light emission chip 110 in the drawing indicate VCSELs 114. As described later, the light emission chip 110 includes an anode electrode 112 and a cathode electrode 113 (not illustrated) that are respectively arranged on the front surface and the rear surface of a semiconductor region 111 (not illustrated). The semiconductor region 111 can be formed by GaAs, for example. Specifically, the semiconductor region 111 of the light emission chip 110 can have a configuration in which a plurality of GaAs layers and Al(Ga)As layers having an N-type and a plurality of GaAs layer and Al(Ga)As layers having a p-type are stacked on a GaAs substrate. Therefore, p-n junction is formed, and a semiconductor multi-layer film mirror reflector is formed by the plurality of GaAs layers and Al(Ga)As layers. By flowing a forward current in the p-n junction, a carrier is injected and light emission occurs, resonance is caused by the multi-layer film mirror reflector, and laser light is emitted.

The substrate 140 is a substrate on which the light emission chip 110 is mounted. Pads 141 and 142 are arranged on the front surface of the substrate 140. Electrodes of the light emission chip 110 are connected to the pads 141 and 142. Furthermore, the terminals 101 and 102 are arranged on the rear surface of the substrate 140. A cathode electrode (not illustrated) of the light emission chip 110 is connected to the pad 141. On the other hand, the anode electrode 112 of the light emission chip 110 is connected to the pad 142 by wire bonding.

The bonding wires 120 connect the anode electrode 112 of the light emission chip 110 and the pad 142 by wire bonding. As illustrated in the drawing, by arranging the plurality of bonding wires 120, interconnection resistance can be reduced.

The frame 150 is a casing arranged to surround the light emission chip 110. The frame 150 seals the light emission chip 110 together with the diffuser panel 160 to be described later.

[Configuration of Light Emitting Element]

Figure 5:
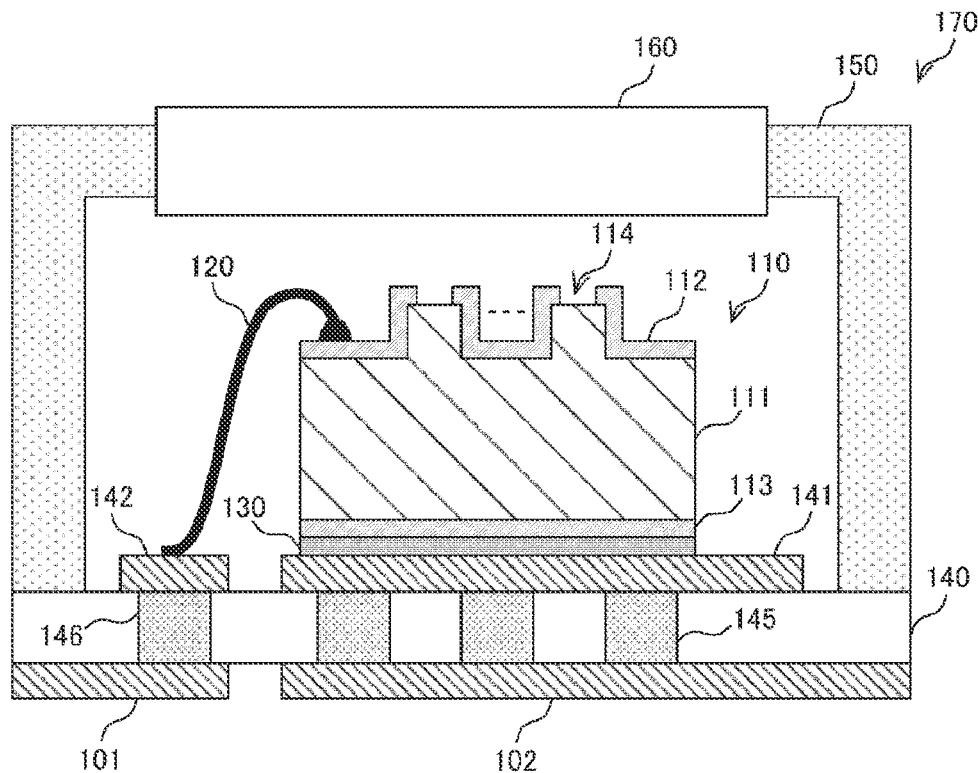
FIG. 5 is a cross-sectional view illustrating a configuration example of the light emitting element according to the second embodiment of the present disclosure.

FIG. 5 is a cross-sectional view illustrating a configuration example of the light emitting element according to the second embodiment of the present disclosure. The drawing is a cross-sectional view illustrating a configuration example of the light emitting element 170.

The diffuser panel 160 is arranged on the top panel of the light emitting element 170, lets through laser light emitted by the light emission chip 110, and converts the laser light into diffused light.

As illustrated in the drawing, the anode electrode 112 of the light emission chip 110 is connected to the pad 142 via the bonding wires 120. The cathode electrode 113 arranged on the rear surface of the light emission chip 110 is connected to the pad 141 via the solder 130. In other words, the cathode electrode 113 is soldered to the pad 141. The pad 141 and The terminal 102 are connected by a plurality of via plugs 145 formed in the substrate 140. Similarly, the pad 142 and the electrode 101 are connected by a via plug 146.

In the light emitting element 170 in the drawing, a wiring path for reaching the cathode electrode 113 via the terminal 102, the via plugs 145, the pad 141, and the solder 130 has a relatively-short wiring distance, and the cathode electrode 113 and the pad 141 are surface-mounted. Thus, interconnection resistance becomes small and the parasitic inductance becomes small as well. On the other hand, a wiring path for reaching the anode electrode 112 via the electrode 101. The via plug 146, the pad 142 and, the bonding wires 120 has relatively-higher interconnection resistance mainly due to the bonding wires 120, and the parasitic inductance becomes large as well. For shortening a rising time of a light emission current flowing through the wiring path, it is necessary to reduce the parasitic inductance of the wiring path connected to the anode electrode 112. For example, by connecting the plurality of bonding wires 120 in parallel, it is possible to reduce The parasitic inductance.

[Mounting Configuration of Light Emitting Element]

Figure 6:
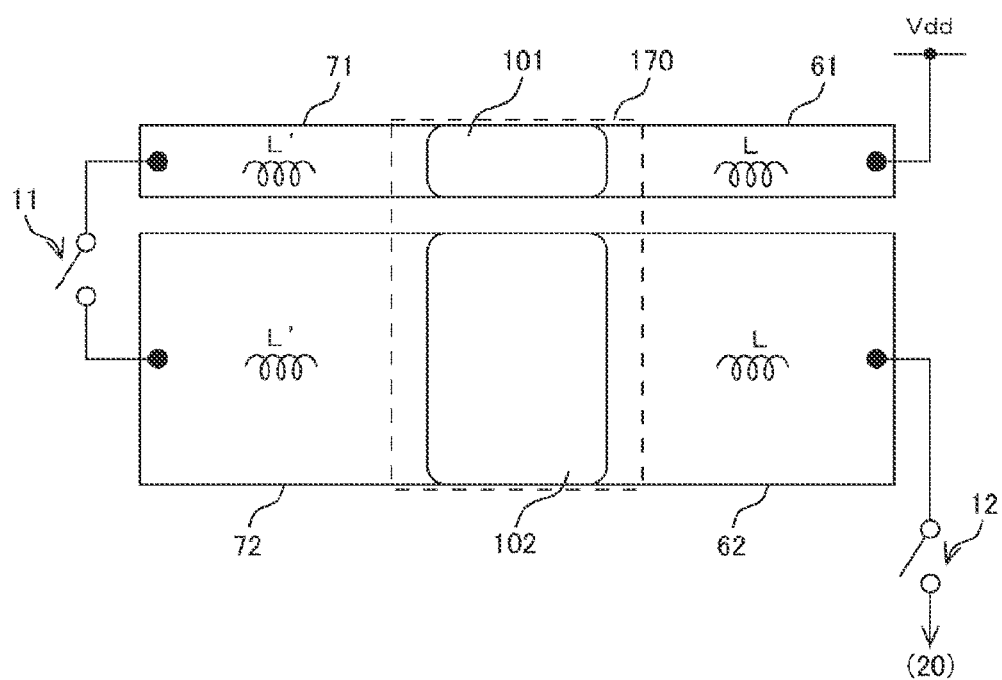
FIG. 6 is a diagram illustrating an example of mounting of the light emitting element according to the second embodiment of the present disclosure.

FIG. 6 is a diagram illustrating an example of mounting of the light emitting element according to the second embodiment of the present disclosure. The drawing is a diagram illustrating the layout of wires on a circuit substrate on which the light emitting element 170, the light emission current switch 12, and the like are mounted, and a state of mounting of the light emitting element 170. Note that, in the drawing, the illustration of the snubber circuits 201 and 202 is omitted. Furthermore, the connection of the light emission current switch 12, the preliminary current switch 11, and the like is schematically illustrated.

As illustrated in the drawing, the wires 61 and 71 are formed on one wiring pattern, and the wires 62 and 72 are formed on another wiring pattern. The terminals 101 and 102 of the light emitting element 170 are mounted on these wiring patterns by soldering, for example. Therefore, the wires 61 and 62 constituting a light emission current wire, and the wires 71 and 72 constituting a preliminary current wire can be separated. As illustrated in the drawing, the parasitic inductances L exist in the wires 61 and 62. By flowing a preliminary current in the wires 61 and 62, these parasitic inductances can be excited. On the other hand, while parasitic inductances L' exist also in the wires 71 and 72, the parasitic inductances L' do not affect the rising of a light emission current.

Because the wires 61 and 62 and the wires 71 and 72 are separated across the terminals 101 and 102, it is possible to reduce a common impedance, and flow a preliminary current throughout the wires 61 and 62 on the substrate when flowing the preliminary current. In other words, a range in which a parasitic inductance affecting the rising of a light emission current is generated can be restricted to the wires inside the light emitting element 170, and the influence of the parasitic inductance can be reduced.

Note that the configuration of the light emission device 1 is not limited to this example. For example, the frame 150 and the like in the light emitting element 170 may be omitted, and the light emission chip 110 can be mounted by bear chip mounting on a substrate on which the light emission current switch 12 and the like are mounted.

Because the configuration of the light emission device 1 other than this is similar to the configuration of the light emission device 1 that has been described in the first embodiment of the present disclosure, the description will be omitted.

As described above, the light emission device 1 according to the second embodiment of the present disclosure can flow a preliminary current in the wires 61 to 64 in a case where the light emitting element 170 having a configuration including two terminals is used, and a rising time of a light emission current flowing in the light emitting element 100 in the light emission period can be shortened.

3. Third Embodiment

The light emission device 1 according to the above-described second embodiment uses the light emitting element 170 having a configuration including two terminals. In contrast to this, a light emission device 1 according to the third embodiment of the present disclosure differs from the above-described second embodiment in that an element in which terminals on an anode side are separated into two is used.

[Configuration of Light Emission Device]

Figure 7:
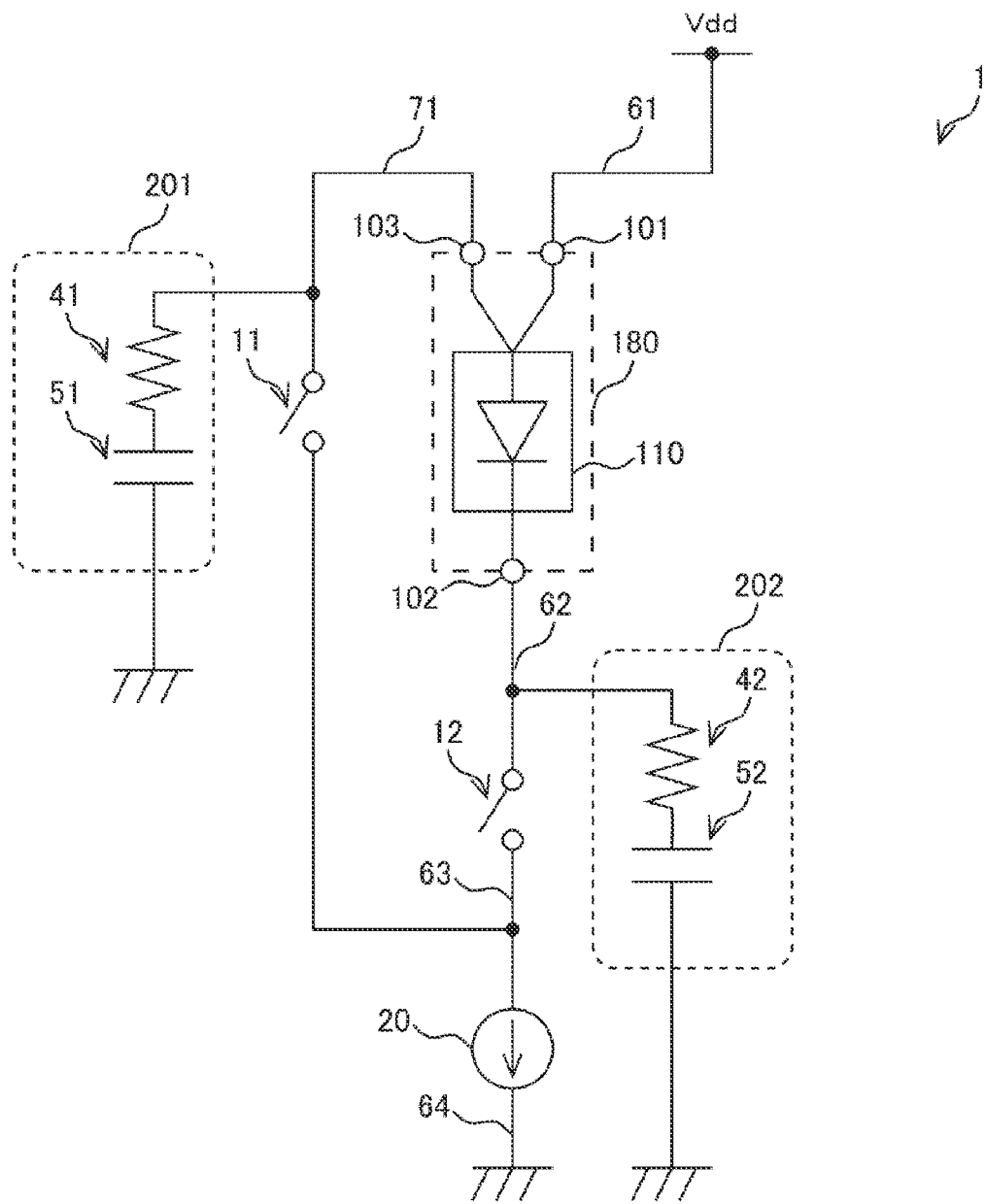
FIG. 7 is a diagram illustrating a configuration example of a light emission device according to a third embodiment of the present disclosure.

FIG. 7 is a diagram illustrating a configuration example of a light emission device according to the third embodiment of the present disclosure. Similarly to FIG. 3, the drawing is a circuit diagram illustrating a configuration example of the light emission device 1. The light emission device 1 in the drawing differs from the light emission device 1 described with reference to FIG. 3, in that a light emitting element 180 is used in place of the light emitting element 170, and the preliminary current switch 11 is directly connected to the constant current source 20.

The light emitting element 180 includes terminals 101 to 103. A wire 61 is connected to the terminal 101 and a wire 71 is connected to the terminal 103. Furthermore, a wire 72 is omitted, and the preliminary current switch 11 is connected between the wire 71 and a wire 63. Because the wire connection other than this is similar to that in FIG. 3, the description will be omitted.

The terminals 101 and 103 of the light emitting element 180 are connected in common to an anode of the light emission chip 110. Unlike the circuit described with reference to FIG. 3, a preliminary current flows via the wire 61, the terminal 101, the anode of the light emission chip 110, the terminal 103, the preliminary current switch 11, and the wire 63. In other words, in the light emission current switch 12, a preliminary current does not flow and only a light emission current flows. In the light emitting element 180 in the drawing, the terminal 103 serves as a preliminary current terminal.

[Configuration of Light Emitting Element]

Figure 8:
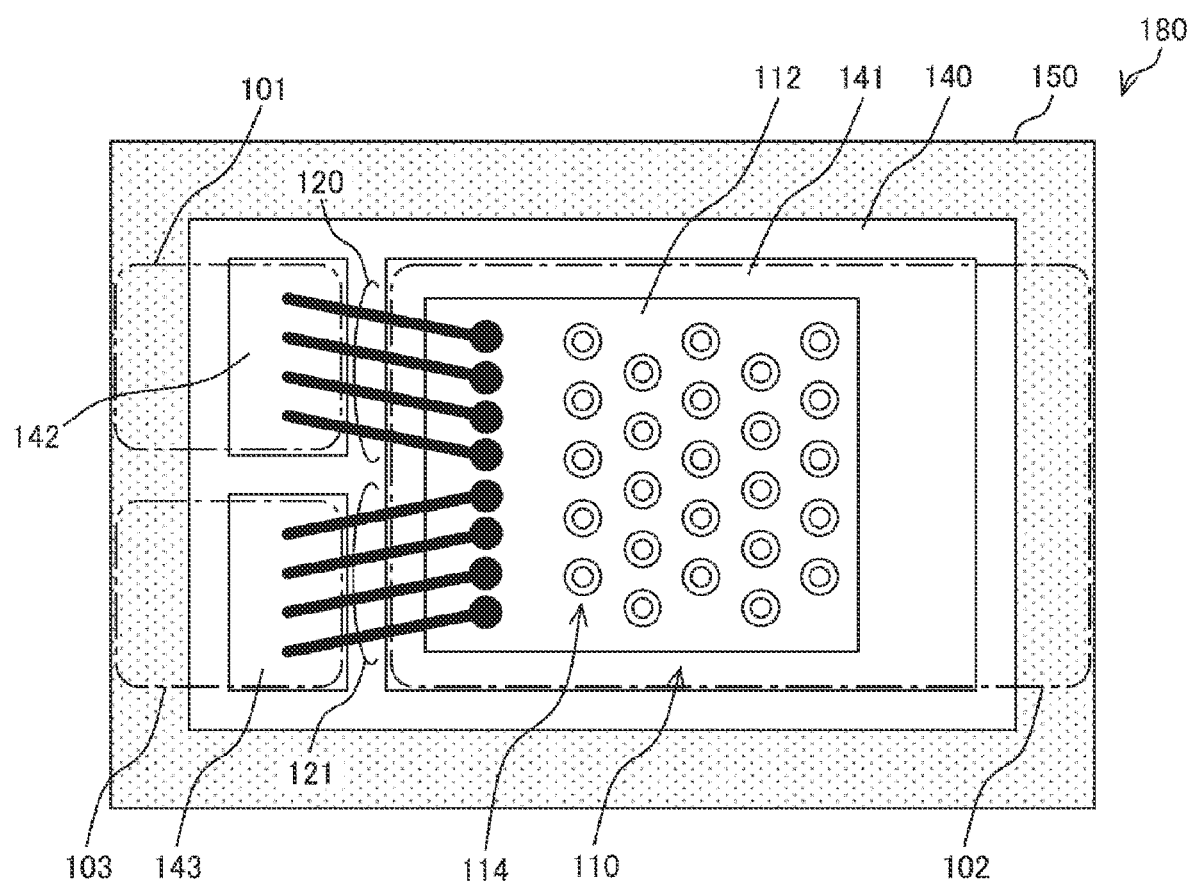
FIG. 8 is a plan view illustrating a configuration example of a light emitting element according to the third embodiment of the present disclosure.

FIG. 8 is a plan view illustrating a configuration example of a light emitting element according to the third embodiment of the present disclosure. The drawing is a plan view illustrating a configuration example of the light emitting element 180. On a substrate 140 in the drawing, the terminal 103 is arranged adjacent to the terminal 101, and a pad 143 corresponding to the terminal 103 is arranged adjacent to a pad 142. The terminal 103 and the pad 142 are connected by a via plug (not illustrated). Similarly to the light emitting element 170 described with reference to FIG. 4, an anode electrode 112 and the pad 142 are connected by bonding wires 120. On the other hand, the anode electrode 112 and the pad 143 are connected by bonding wires 121. In this manner, the anode electrode 112 is connected with the terminals 101 and 103 through different wiring paths.

[Mounting Configuration of Light Emitting Element]

Figure 9:
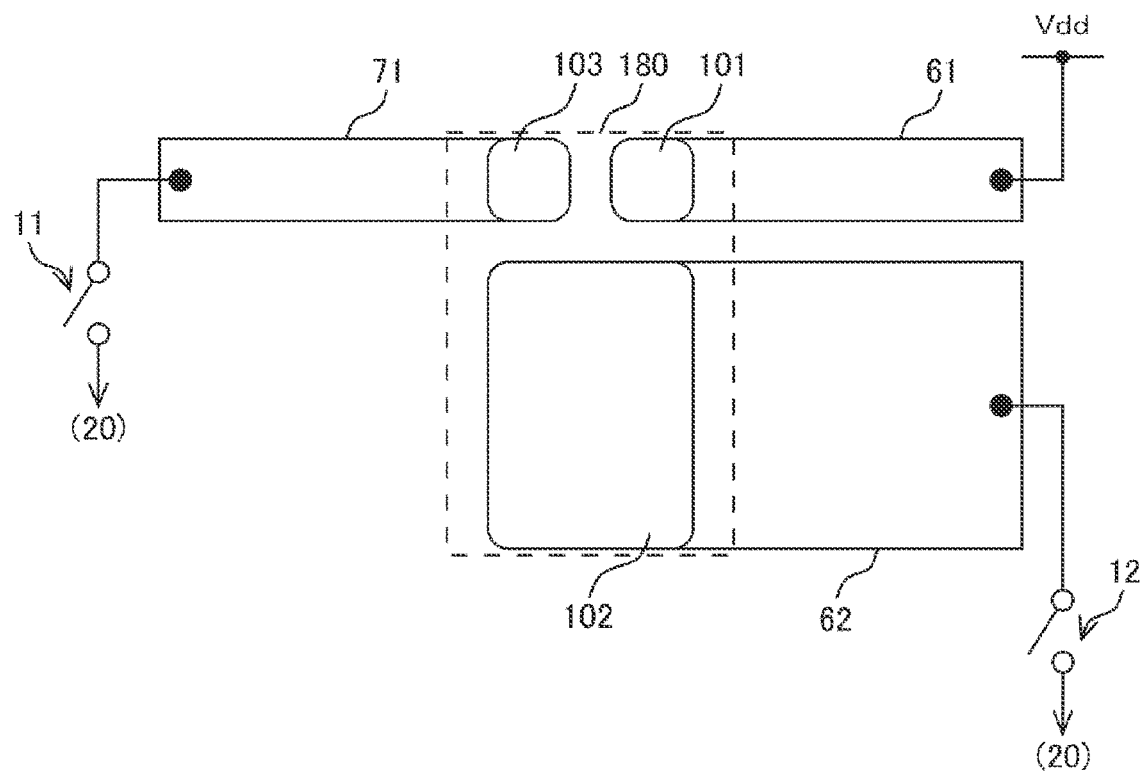
FIG. 9 is a diagram illustrating an example of mounting of the light emitting element according to the third embodiment of the present disclosure.

FIG. 9 is a diagram illustrating an example of mounting of the light emitting element according to the third embodiment of the present disclosure. The drawing is a diagram illustrating the layout of wires and a state of mounting of the light emitting element 100 similarly to FIG. 6.

As illustrated in the drawing, the wire 61 is connected to the terminal 101 of the light emitting element 180, and the wire 71 is connected to the terminal 103. Unlike the layout of wires in FIG. 6, the wires 61 and 71 are formed on different wiring patterns in a separated manner. Therefore, paths connecting the anode electrode 1112 of the light emission chip 110 and the wires 61 and 71, which have been described with reference to FIG. 8, can be separated. A range in which a parasitic inductance affecting the rising of a light emission current is generated can be restricted to the anode electrode 112 of the light emission chip 110, and the influence of the parasitic inductance can be further reduced.

[Driving Method of Light Emitting Element]

Figure 10:
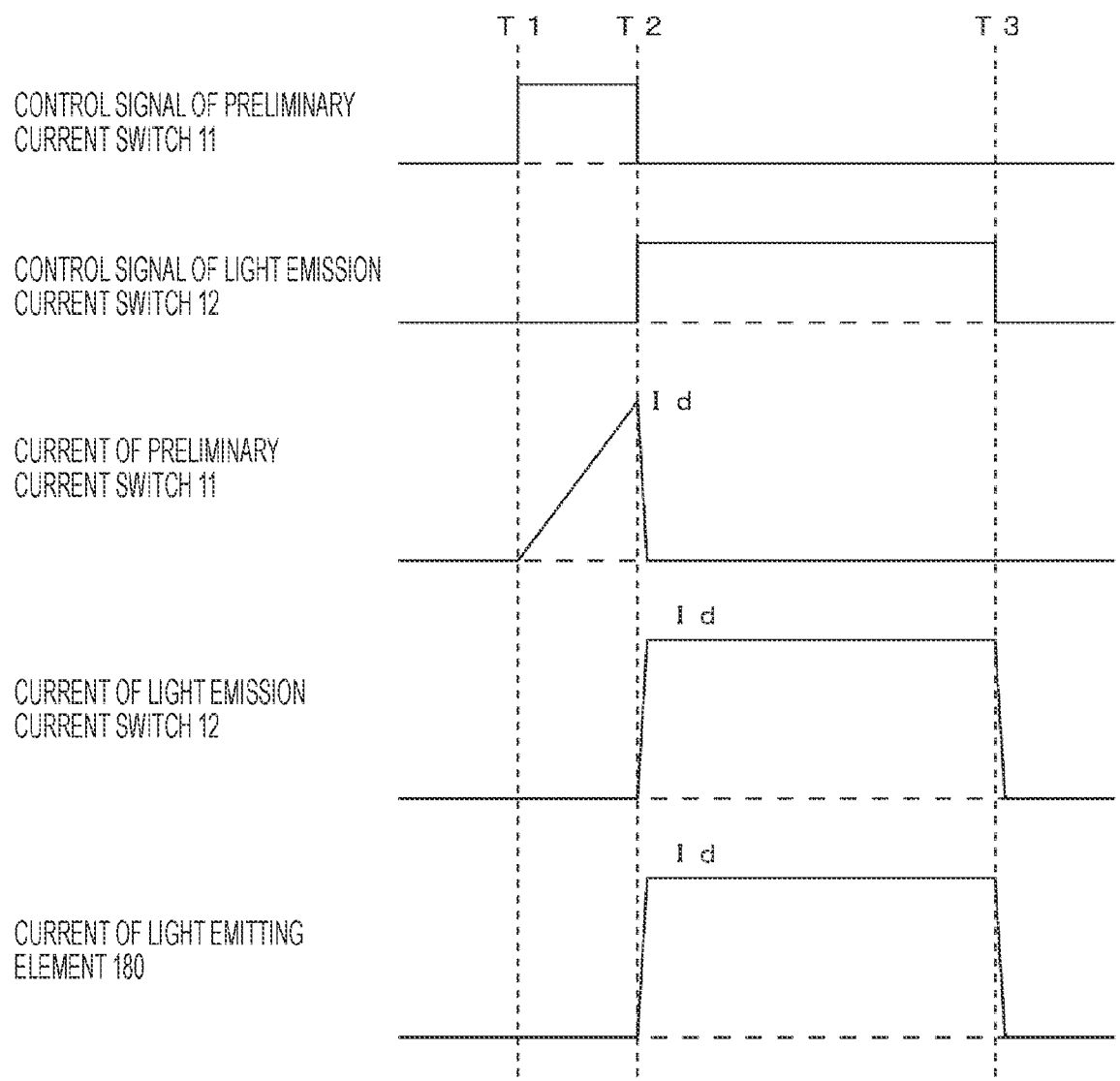
FIG. 10 is a diagram illustrating an example of a driving method of the light emission device according to the third embodiment of the present disclosure.

FIG. 10 is a diagram illustrating an example of a driving method of the light emission device according to the third embodiment of the present disclosure. Similarly to FIG. 2, the drawing is a diagram illustrating a relationship between control signals of the preliminary current switch 11 and the light emission current switch 12, and currents of the preliminary current switch 11, the light emission current switch 12, and the light emitting element 100. The description of parts similar to those in FIG. 2 will be omitted.

At T1, an ON signal is applied to the preliminary current switch 11. Therefore, the preliminary current switch 11 transitions to the conductive state, and a preliminary current starts to flow in the wire 71 from the wire 61 through an anode of the light emission chip 110. Similarly to FIG. 2, a preliminary current increasing like a ramp function flows.

At T2, the application of the ON signal to the preliminary current switch 11 is stopped and the preliminary current switch 11 is caused to transition to the nonconductive state, and an ON signal is applied to the light emission current switch 12 and the light emission current switch 12 is caused to transition to the conductive state. A flow path of a current Id that had been flowing in the preliminary current switch 11 changes to the light emitting element 100 and the light emission current switch 12, and the current Id flows through the changed flow path. Because the parasitic inductance of a wiring path for reaching the anode of the light emission chip 110 from the wire 61 and the terminal 101 of the light emitting element 180 is excited by the preliminary current, a rising time of a current flowing in the light emission current switch 12 and the light emitting element 180 can be shortened.

At T3, the application of the ON signal to the light emission current switch 12 is stopped. Therefore, the light emission current switch 12 transitions to the nonconductive state, a light emission current flowing in the light emitting element 180 is blocked, and emission of laser light from the light emitting element 180 is stopped.

As described with reference to FIG. 5, as compared with a wire on the cathode side of the light emission chip 110, a wire on the anode side has a relatively-large parasitic inductance due to the influence of bonding wires. In view of the foregoing, as illustrated in FIG. 8, by separating wires on the anode side into bonding wires 120 and 121, and flowing a preliminary current in both of the bonding wires 120 and 121, the parasitic inductance of a path for reaching the anode electrode 112 from the terminal 101 of the light emitting element 180 can be further excited. Therefore, a rising time of a light emission current can be shortened. For example, in a case where a light emission current is set to 6 A, a rising time of the light emission current of the light emitting element 180 can be set to about 270 ps. Even in a case where a light emission period is short, the light emission device 1 according to the present disclosure can be applied. For example, the light emission device 1 according to the present disclosure can be applied to pulse driving that repeats a light emission period of 2 ns, and the like.

[Another Configuration of Light Emitting Element]

Figure 11:
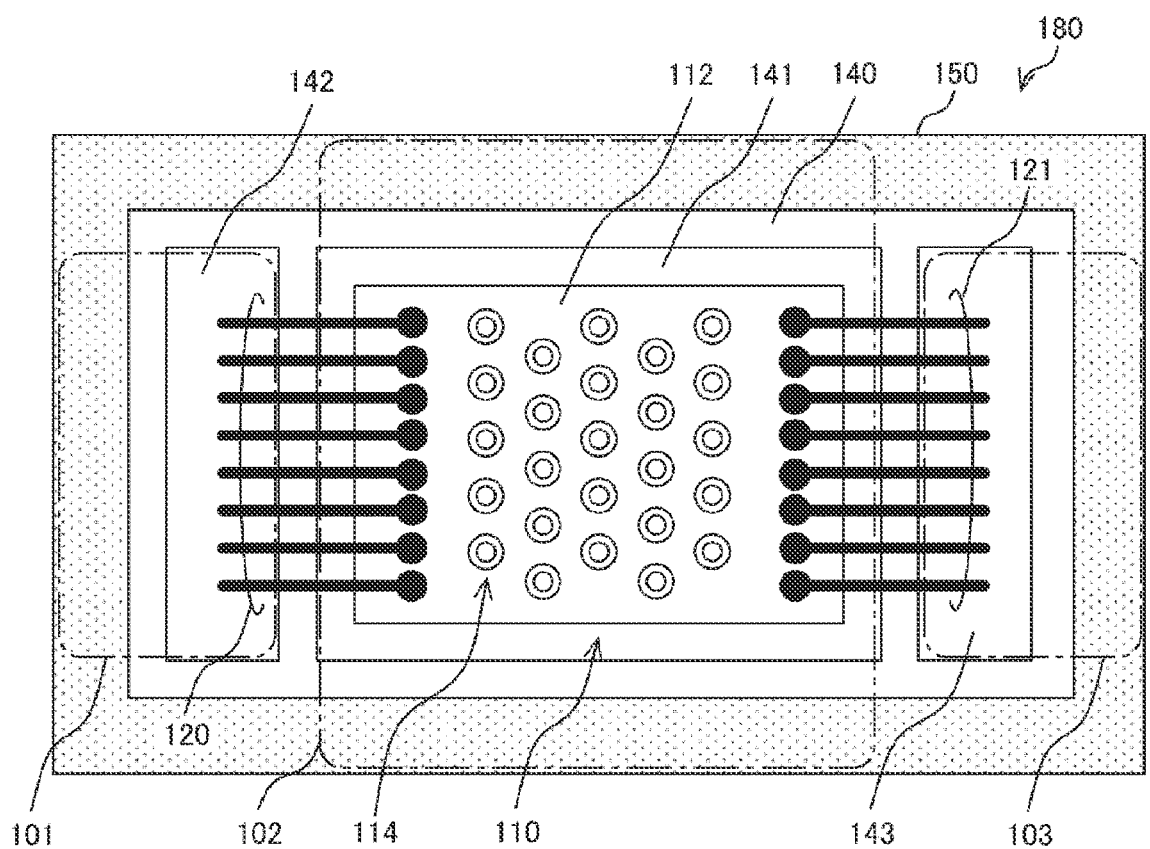
FIG. 11 is a plan view illustrating another configuration example of a light emitting element according to the third embodiment of the present disclosure.

FIG. 11 is a plan view illustrating another configuration example of a light emitting element according to the third embodiment of the present disclosure. The drawing is a plan view illustrating another configuration example of the light emitting element 180. In the light emitting element 180 in the drawing, pads 142 and 143 are respectively arranged adjacent to two facing sides of a rectangular light emission chip 110. From the anode electrode 112, the bonding wires 120 are connected to the pad 142 and the bonding wires 121 are connected to the pad 143. Because the bonding wires 120 and 121 can be arranged on different sides of the light emission chip 110, relatively-larger numbers of bonding wires 120 and 121 can be arranged. Connection resistance can be further reduced.

Because the configuration of the light emission device 1 other than this is similar to the configuration of the light emission device 1 that has been described in the third embodiment of the present disclosure, the description will be omitted.

As described above, the light emission device 1 according to the third embodiment of the present disclosure includes the light emitting element 180 in which the pad 142 and the bonding wires 120, and the pad 143 and the bonding wires 121 are arranged as wires on the anode side of the light emission chip 110. These two wires are respectively connected to the terminal 101 serving as a light emission current terminal, and the terminal 103 serving as a preliminary current terminal. Therefore, the influence of parasitic inductances of wires on the anode side of the light emission chip 110 can be reduced. On the other hand, by performing solder mounting, parasitic inductances of wires on the cathode side of the light emission chip 110 can be reduced, and an easier mounting (connection.) method can be applied.

4. Fourth Embodiment

The light emission device 1 according to the above-described third embodiment uses the light emitting element 180 having a configuration including three terminals, and performs driving by flowing a preliminary current and a light emission current. In contrast to this, a light emission device 1 according to the fourth embodiment of the present disclosure differs from the above-described third embodiment in that a bias current is further supplied to a light emitting element.

[Configuration of Light Emission Device]

Figure 12:
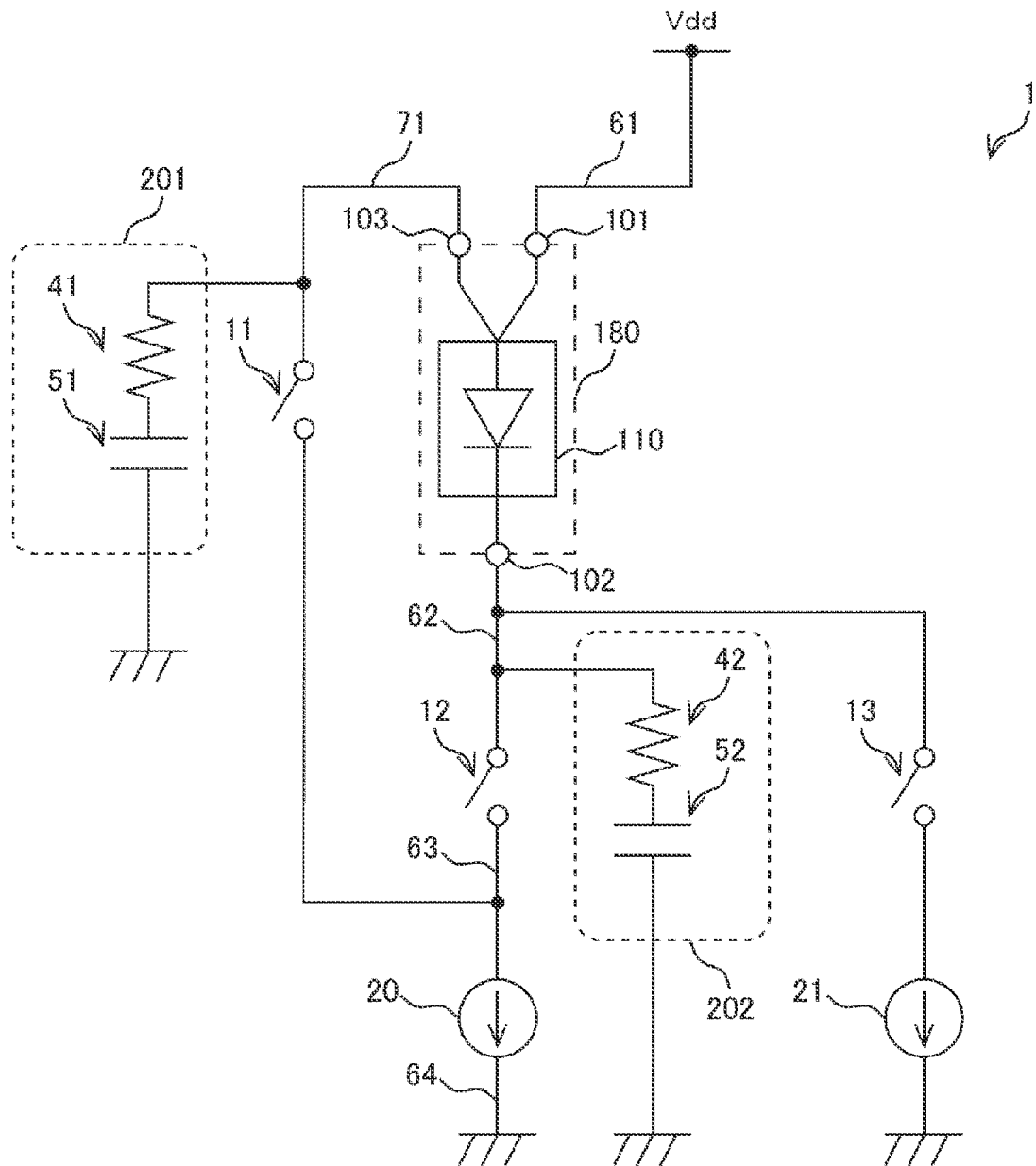
FIG. 12 is a diagram illustrating a configuration example of a light emission device according to a fourth embodiment of the present disclosure.

FIG. 12 is a diagram illustrating a configuration example of a light emission device according to the fourth embodiment of the present disclosure. Similarly to FIG. 7, the drawing is a circuit diagram illustrating a configuration example of the light emission device 1. The light emission device 1 in the drawing differs from the light emission device 1 described with reference to FIG. 7, in that a switch 13 and a constant current source 21 are further included.

One end of the switch 13 is connected to the wire 62, and another end of the switch 13 is grounded via the constant current source 21. Because the wire connection of the circuits other than this is similar to that in the light emission device 1 illustrated in FIG. 7, the description will be omitted.

The switch 13 is an element reversibly transitioning to two states including a conductive state and a nonconductive state, and a MOS transistor can be used similarly to the preliminary current switch 11 and the light emission current switch 12. The switch 13 is a switch that controls a bias current to be flowed in the light emitting element 180. Here, the bias current is a current flowed in the light emitting element 180 before a light emission period, and is a current smaller than a light emission current. As described with reference to FIG. 4, by flowing a forward current in the light emission chip 110, a carrier is injected and laser light is emitted. However, for emitting laser light, it is necessary to inject a carrier with predetermined concentration, and a time lag is generated between a supply start of the forward current and the emission of laser light. In view of the foregoing, by flowing the bias current in the light emitting element 180 before the light emission period, a time lag until the emission of laser light can be shortened. A current close to a light emission threshold, which is a threshold current or generating light emission in the light emitting element 180, for example, can be applied as the bias current. For example, a current with 500 mA can be adopted as the bias current.

The constant current source 21 is a circuit that flows the bias current in the light emitting element 180. The constant current source 21 is a circuit that restricts a current flowing in the light emitting element 180, to a predetermined bias current on the basis of a source voltage supplied from the power line Vdd, similarly to the constant current source 20.

Note that a circuit including the switch 13 and the constant current source 21 serves as an example of a bias circuit described in the appended claims.

[Driving Method of Light Emitting Element]

Figure 13:
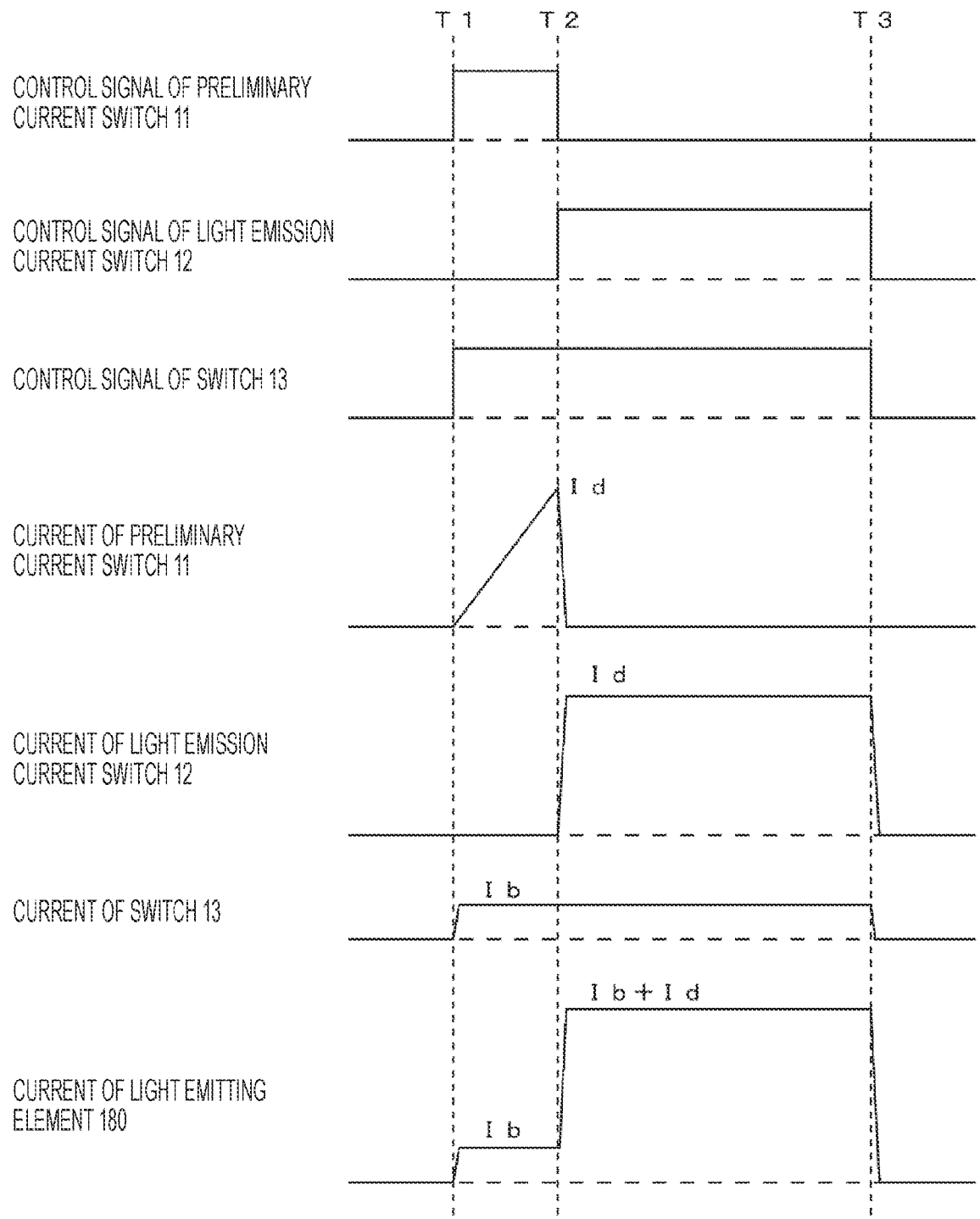
FIG. 13 is a diagram illustrating an example of a driving method of the light emission device according to the fourth embodiment of the present disclosure.

FIG. 13 is a diagram illustrating an example of a driving method of the light emission device according to the fourth embodiment of the present disclosure. The drawing is a diagram illustrating a relationship between control signals of the preliminary current switch 11, the light emission current switch 12, and the switch 13, and currents of the preliminary current switch 11, the light emission current switch 12, the switch 13, and the light emitting element 180. The description of parts similar to those in FIG. 2 will be omitted.

At T1, ON signals are applied to the preliminary current switch 11 and the switch 13. Therefore, the preliminary current switch 11 and the switch 13 transition to the conductive state, a preliminary current flows and a bias current Ib flows in the light emitting element 100. Because the bias current Ib being a current close to the light emission threshold flows in the light emitting element 100, a carrier is injected to p-n junction of the light emission chip 110 incorporated inside the light emitting element 100.

At T2, the application of the ON signal to the preliminary current switch 11 is stopped, and the ON signal is applied to the light emission current switch 12 in addition to the bias current Ib, the current Id flows in the light emitting element 100. Because a carrier is injected to the light emission chip 110 in the period from T1 to T2, the light emitting element 100 starts to emit laser light immediately after the inflow of the current Id.

At T3, the application of the ON signals to the switch 13 and the light emission current switch 12 is stopped. Therefore, emission of laser light from the light emitting element 100 is stopped.

In this manner, by flowing the bias current in the light emitting element 100 before the light emission period, a latency time of emission of laser light from the light emitting element 100 can be shortened. It is possible to reduce an error generated when the light emission device 1 used in a distance measuring sensor or the like.

Because the configuration of the light emission device 1 other than this is similar to the configuration of the light emission device 1 that has been described in the third embodiment of the present disclosure, the description will be omitted.

As described above, the light emission device 1 according to the fourth embodiment of the present disclosure can further shorten a time from the supply of a light emission current to the emission of laser light in the light emitting element 100, by flowing the bias current in the light emitting element 100.

5. Fifth Embodiment

The light emission device 1 according to the above-described third embodiment restricts a current flowing in the light emitting element 100, using the constant current source 20. In contrast to this, a light emission device 1 according to the fifth embodiment of the present disclosure differs from the above-described third embodiment in that a current flowing in the light emitting element 100 is restricted using a resistor.

[Configuration of Light Emission Device]

Figure 14:
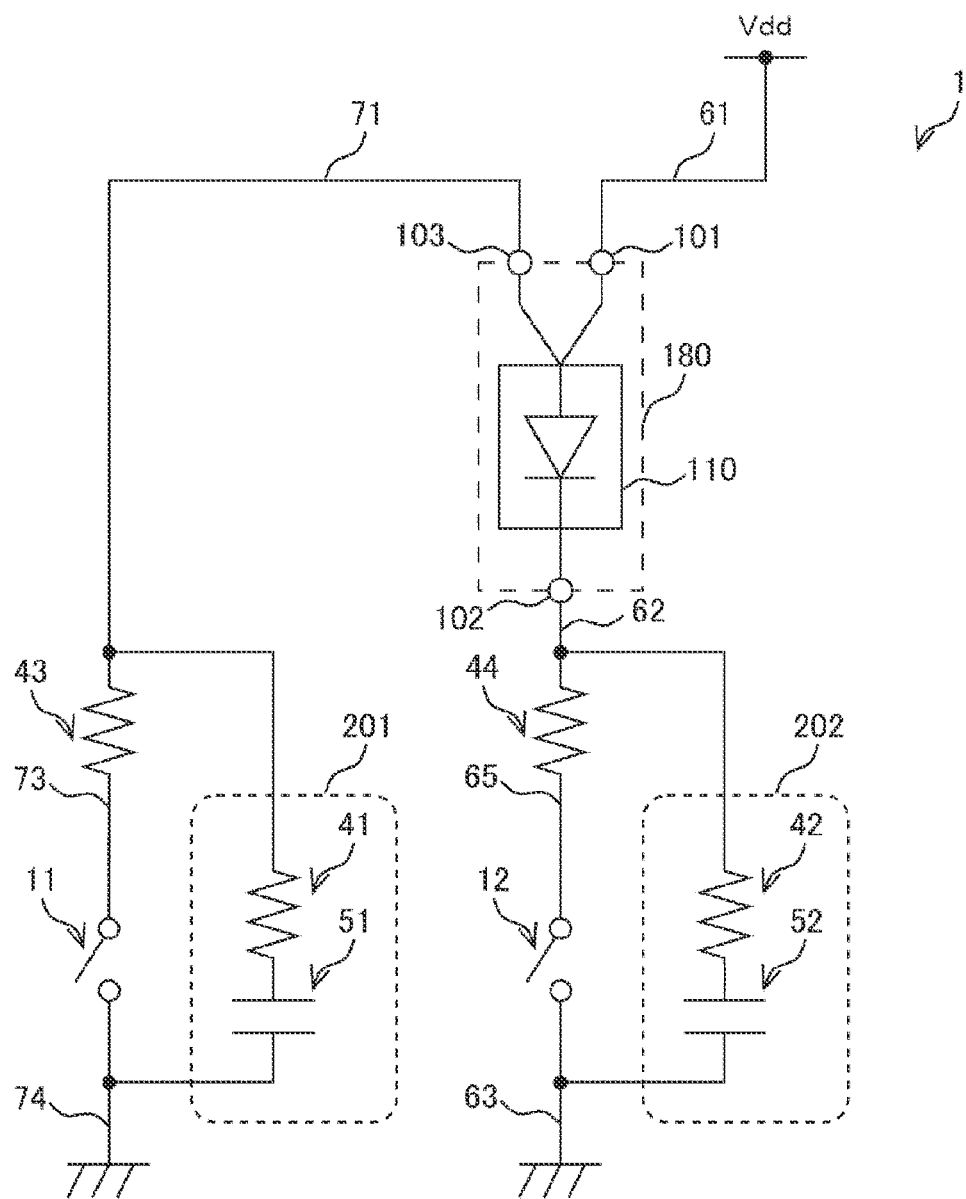
FIG. 14 is a diagram illustrating a configuration example of a light emission device according to a fifth embodiment of the present disclosure.

FIG. 14 is a diagram illustrating a configuration example of a light emission device according to the fifth embodiment of the present disclosure. Similarly to FIG. 7, the drawing is a circuit diagram illustrating a configuration example of the light emission device 1. The light emission device 1 in the drawing differs from the light emission device 1 described with reference to FIG. 7, in that resistors 43 and 44 are included in place of the constant current source 20.

One end of the preliminary current switch 11 is connected to the wire 71 via the resistor 43, and another end of the preliminary current switch 11 is grounded. One end of the light emission current switch 12 is connected to the wire 62 via the resistor 44, and another end of the light emission current switch 12 is grounded. The snubber circuit 201 is connected between the wire 71 and the grounding wire, and the snubber circuit 202 is connected between the wire 62 and the grounding wire. Because the wire connection or the circuits other than this is similar to that in the light emission device 1 illustrated in FIG. 12, the description will be omitted.

Note that a wire 73 between the preliminary current switch 11 and the resistor 43, and a wire 74 between the preliminary current switch 11 and the grounding wire constitute a preliminary current wire together with the wire 71. A wire 65 between the light emission current switch 12 and the resistor 44, and the wire 63 between the light emission current switch 12 and the grounding wire constitute a light emission current wire together with the wires 61 and 62.

The resistor 43 is a resistor that restricts a preliminary current to a predetermined value. A preliminary current that flows when the preliminary current switch 11 transitions to the conductive state is restricted to a value obtained by dividing a source voltage supplied from the power line Vdd, using the resistor 43, if ON resistance of the preliminary current switch 11 in the conductive state and the like are ignored.

The resistor 44 is a resistor that restricts a light emission current flowing in the light emitting element 180, to a predetermined value. A light emission current that flows when the light emission current switch 12 transitions to the conductive state is restricted to a value obtained by dividing a source voltage supplied from the power line Vdd, using the resistor 44, if ON resistance of the light emission current switch 12 in the conductive state, a forward voltage of the light emitting element 180, and the like are ignored.

By changing values of the resistors 43 and 44, a preliminary current and a light emission current can be individually set. For example, the resistors 43 and 44 having values that set the preliminary current and the light emission current to substantially equal currents can adopted. Note that a circuit including the resistor 43 and the power line Vdd serves as an example of a power circuit described in the appended claims. A circuit including the resistor 44 and the power line Vdd serves as an example of a power circuit described in the appended claims.

On the other hand, the resistors 43 and 44 having values that set the preliminary current and the light emission current to currents with different values can also be adopted. In a case where the preliminary current and the light emission current are set to currents with different values, a light emission current that flows when a period is shifted from a period for flowing a preliminary current, to the light emission period can be changed. An example of a case where the preliminary current and the light emission current are set to currents with different values will be described next.

[Driving Method of Light Emitting Element]

Figure 15:
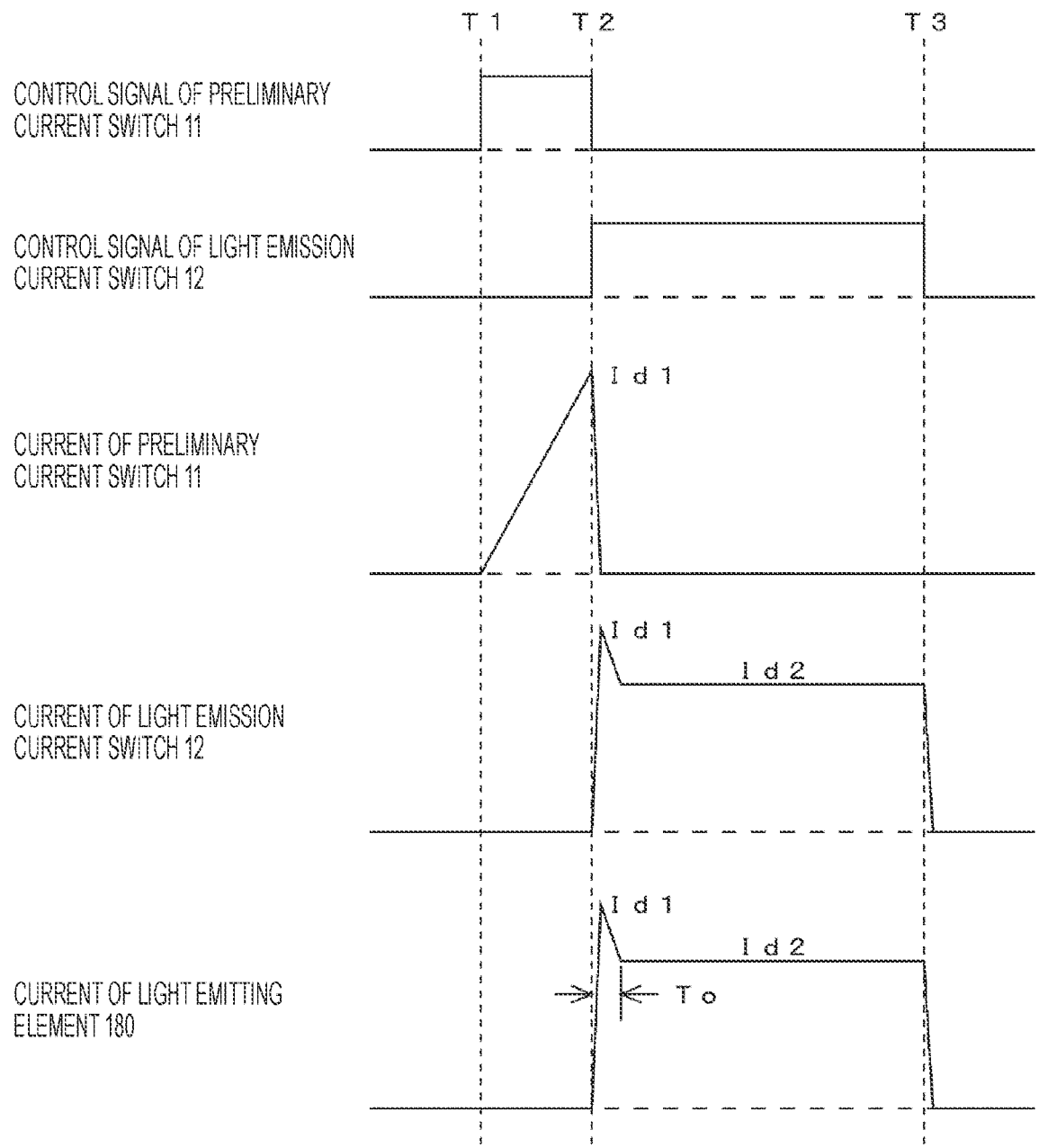
FIG. 15 is a diagram illustrating an example of a driving method of the light emission device according to the fifth embodiment of the present disclosure.

FIG. 15 is a diagram illustrating an example of a driving method of the light emission device according to the fifth embodiment of the present disclosure. The drawing is a diagram illustrating a relationship between control signals of the preliminary current switch 11 and the light emission current switch 12, and currents of the preliminary current switch 11, the light emission current switch 12, and the light emitting element 180. The description of parts similar to those in FIG. 2 will be omitted.

In the example in the drawing, a current set by the resistor 43 is denoted by Id1, and a current set by the resistor 44 is denoted by Id2. Furthermore, the current Id1 is a current larger than the current Id2.

At T1, an ON signal is applied to the preliminary current switch 11. Therefore, the preliminary current switch 11 transitions to the conductive state, and the current Id1 flows.

At T2, the application of the ON signal to the preliminary current switch 11 is stopped, and the ON signal is applied to the light emission current switch 12. As described above, because the current Id1 is larger than the current Id2, due to the influence of the parasitic inductance of the wire 61 and the like, the current Id1 flows as a light emission current in the light emitting element 180 immediately after the shift to T2. The current changes from Id1 to Id2 like a ramp function. In this manner, at the beginning of the light emission period, a light emission current larger than the current Id2 set by the resistor 44 flows.

At T3, the application of the ON signal to the light emission current switch 12 is stopped. Therefore, the current Id2 that had been flowing in the light emitting element 180 is blocked.

During an initial period. To in the light emission period, a current larger than the current Id2 flows in the light emitting element 180. By the current flowing during the period To, an excessive current larger than a steady light emission current (Id2) in the light emission period flows in the light emission chip 110 of the light emitting element 180. Therefore, charging of the parasitic capacitance of the light emission chip 110 such as, for example, capacitance components between the anode electrode 112 and the cathode electrode 113 that have been described with reference to FIG. 5 can be performed at high speed, and the application of a voltage to the semiconductor region 111 can be performed at high speed. Furthermore, injection of the carrier to the light emission chip 110 can also be performed at high speed.

In this manner, by flowing a light emission current with a high value in the light emitting element 180 at the beginning of the light emission period, it becomes possible to execute so-called overdrive, and shorten a light emission latency time.

[Another Configuration of Light Emission Device]

Figure 16:
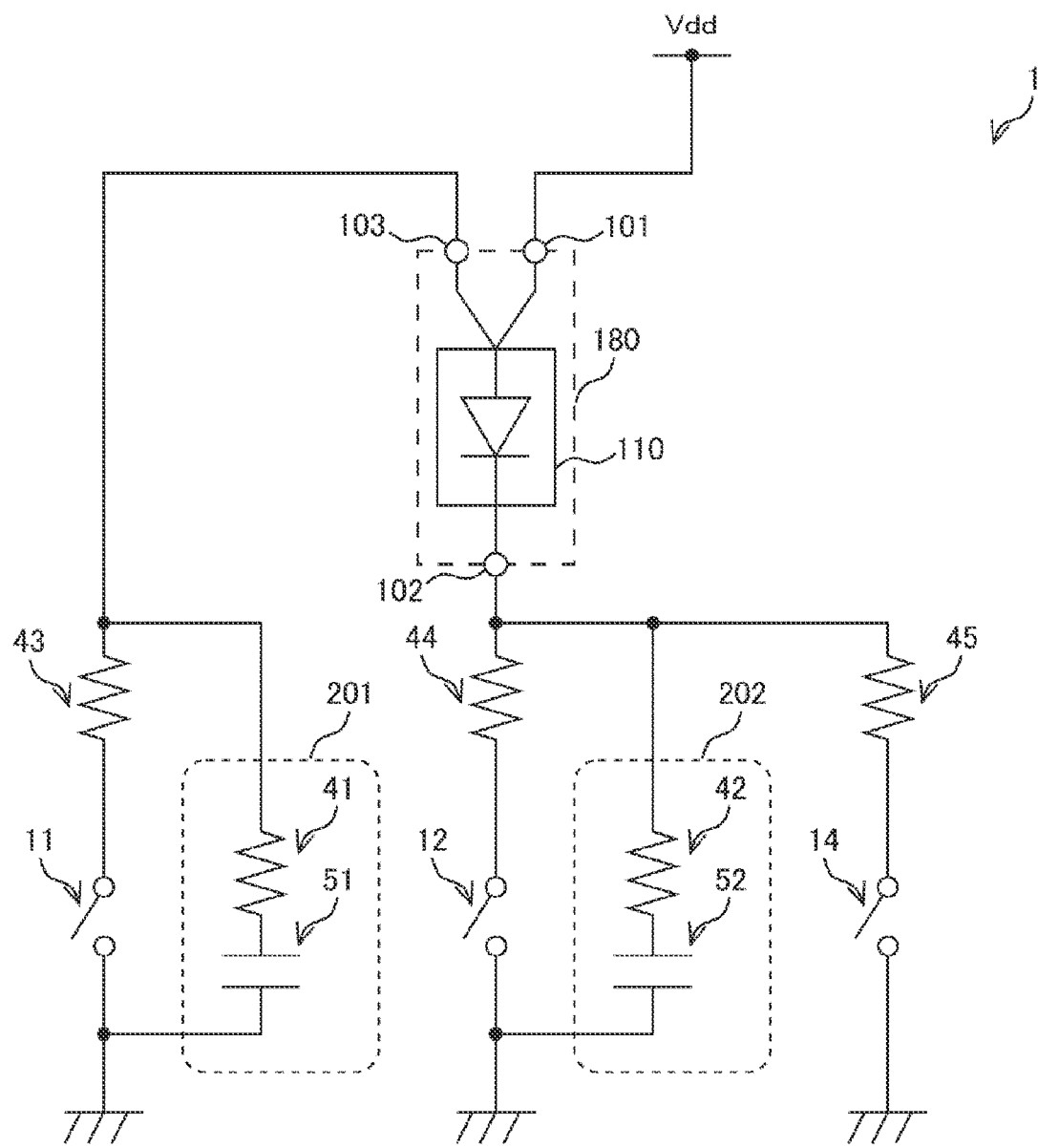
FIG. 16 is a diagram illustrating another configuration example of a light emission device according to the fifth embodiment of the present disclosure.

FIG. 16 is a diagram illustrating another configuration example of a light emission device according to the fifth embodiment of the present disclosure. A light emission device 1 in the drawing is different from the light emission device 1 described with reference to FIG. 14, in that a resistor 45 and a switch 14 are further included. Note that, in the drawing, the illustration of reference numerals of the wire 61 and the like is omitted.

One end of the switch 14 is connected to the terminal 102 of the light emitting element 180 via the resistor 45, and another end of the switch 14 is grounded. Because the wire connection of the circuits other than this is similar to that in the light emission device 1 illustrated in FIG. 14, the description will be omitted.

The switch 14 transitions to the conductive state in the light emission period, and controls a light emission current with a value different from the light emission current switch 12.

The resistor 45 is a resistor that restricts a light emission current flowing in the light emitting element 180, to a predetermined value. By individually flowing a light emission current via the resistor 45 using the switch 14, a light emission current with a different value can be flowed in the light emitting element 180. In other words, a light emission current flowing in the light emitting element 180 during the light emission period can be changed. Specifically, the resistor 45 can be set to a resistance value varying in accordance with the current Id1 described with reference to FIG. 15, and during the period To, the switch 14 can be caused to transition to the conductive state in place of the light emission current switch 12. Therefore, the current Id1 having a rectangular waveform can be supplied to the light emitting element 180.

Note that the configuration of the light emission device 1 is not limited to this example. For example, a light emission current can be changed by causing the switch 14 to transition to the conductive state during a period other than the initial period of the light emission period.

Because the configuration of the light emission device 1 other than this is similar to the configuration of the light emission device 1 that has been described in the third embodiment of the present disclosure, the description will be omitted.

Note that, in the fifth embodiment of the present disclosure, a preliminary current and a light emission current are restricted using the resistors 43 and 44, but the constant current source 20 and the like can be applied similarly to the other embodiments. Furthermore, in the above-described first to fourth embodiments, a circuit that uses the resistors 43 and 44 in place of the constant current source 20 can be employed.

As described above, the light emission device 1 according to the fifth embodiment of the present disclosure can further shorten a light emission latency time by flowing a light emission current with a different value in the light emitting element 100.

6. Sixth Embodiment

In the light emission device 1 according to the above-described third embodiment, wires on the anode side of the light emission chip 110 are branched into the two terminals 101 and 103 of the light emitting element 180. In contrast to this, a light emission device 1 according to the sixth embodiment of the present disclosure differs from the above-described third embodiment in that wires on the cathode side of the light emission chip 110 are branched into two terminals of a light emitting element.

[Configuration of Light Emission Device]

Figure 17:
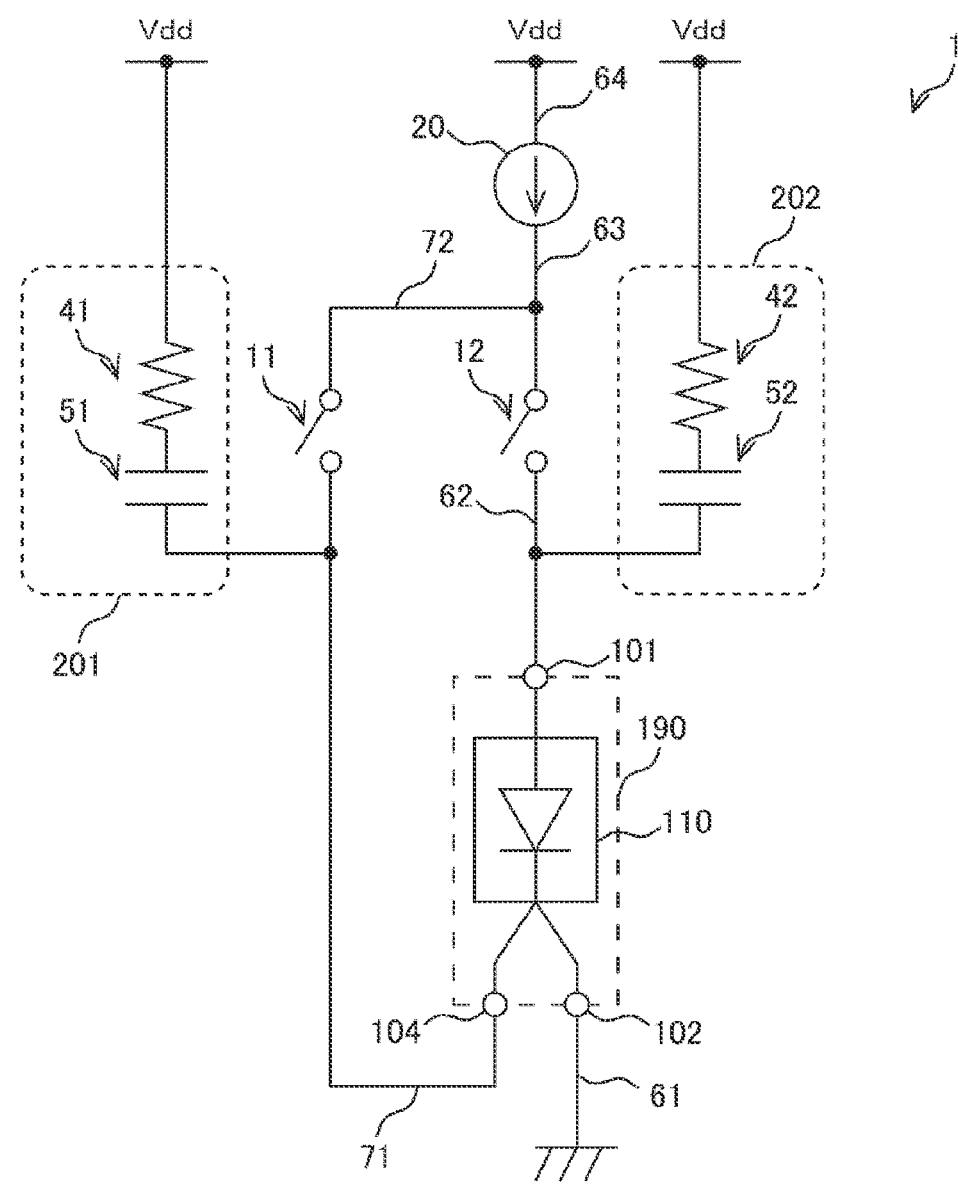
FIG. 17 is a diagram illustrating a configuration example of a light emission device according to a sixth embodiment of the present disclosure.

FIG. 17 is a diagram illustrating a configuration example of a light emission device according to the sixth embodiment of the present disclosure. Similarly to FIG. 7, the drawing is a circuit diagram illustrating a configuration example of the light emission device 1. The light emission device 1 in the drawing differs from the light emission device 1 described with reference to FIG. 7, in that a light emitting element 190 is included in place of the light emitting element 180.

The light emitting element 190 includes terminals 101, 102, and 104. One end of the constant current source 20 is connected to the power line Vdd, and another end is connected to one end of the preliminary current switch 11 and one end of the light emission current switch 12. Another end of the preliminary current switch 11 is connected to the terminal 104 of the light emitting element 190 via the wire 71, and another end of the light emission current switch 12 is connected to the terminal 101 of the light emitting element 190 via the wire 62. The terminal 102 of the light emitting element 190 is grounded. The snubber circuit 201 is connected between the power line Vdd and the wire 71, and the snubber circuit 202 is connected between the power line Vdd and the wire 62. Furthermore, the snubber circuits 201 and 202 are connected to the power line Vdd being a low-impedance node.

The light emitting element 190 is different from the light emitting element 180 in that the anode of the light emission chip 110 is connected to the shared terminal 101, and the cathode is connected to the two terminals 102 and 104 in a separated manner.

Because the configuration of the light emission device 1 other than this is similar to the configuration of the light emission device 1 that has been described in the third embodiment of the present disclosure, the description will be omitted.

As described above, the light emission device 1 according to the sixth embodiment of the present disclosure can make the rising of a light emission current faster in the light emitting element 190 in which wires to the cathode of the light emission chip 110 are connected to two terminals in a separated manner.

7. Seventh Embodiment

The light emission device 1 according to the above-described second embodiment has a configuration in which the light emitting element 170 including the light emission chip 110 is mounted on a circuit substrate. In contrast to this, a light emission device 1 according to the seventh embodiment of the present disclosure differs from the above-described third embodiment in that semiconductor elements such as the light emission chip 110, the preliminary current switch 11, and the light emission current switch 12 are sealed in one package.

[Configuration of Light Emission Device]

Figure 18:
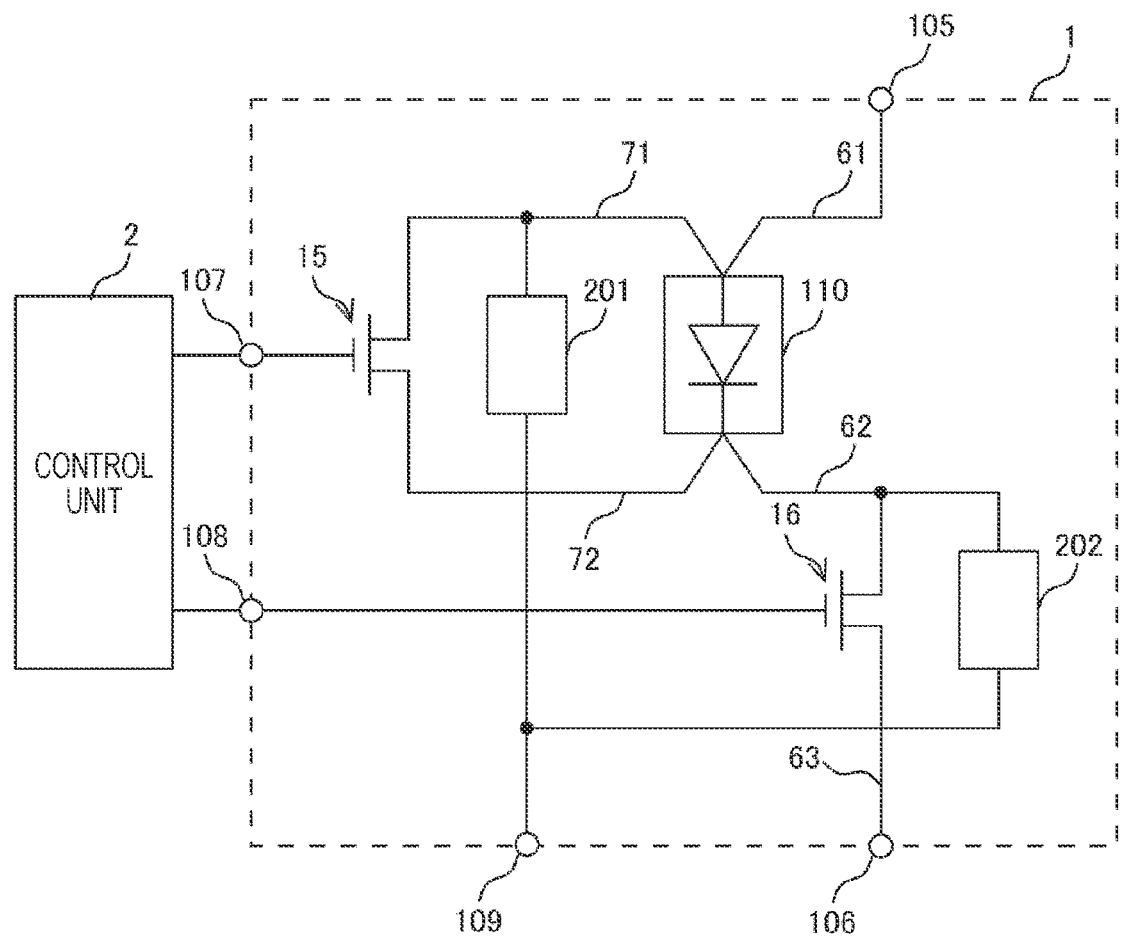
FIG. 18 is a diagram illustrating a configuration example of a light emission device according to a seventh embodiment of the present disclosure.

FIG. 18 is a diagram illustrating a configuration example of a light emission device according to the seventh embodiment of the present disclosure. Similarly to FIG. 3, the drawing is a circuit diagram illustrating a configuration example of the light emission device 1. The light emission device 1 in the drawing differs from the light emission device 1 described with reference to FIG. 3, in that the constant current source 20 is omitted, and the light emission chip 110 is mounted in place of the light emitting element 170. Furthermore, in the light emission device 1 in the drawing, MOS transistors 15 and 16 are arranged as examples of the preliminary current switch 11 and the light emission current switch 12. As the MOS transistors 15 and 16, n-channel MOS transistors can be used.

The light emission device 1 in the drawing has a configuration in which the light emission chip 110, the MOS transistors 15 and 16, and the snubber circuits 201 and 202 are sealed in one package. In other words, the light emission device 1 in the drawing has a modular configuration including the light emission chip 110, MOS transistors, and the like, as an example.

The light emission device 1 in the drawing includes terminals 105 to 109. The terminal 105 is connected to an anode of the light emission chip 110 via the wire 61. A drain of the MOS transistor 15 is connected to the anode of the light emission chip 110 via the wire 71. A source of the MOS transistor 15 is connected to a cathode of the light emission chip 110 via the wire 72. A drain of the MOS transistor 16 is connected to the cathode of the light emission chip 110 via the wire 62. A cathode of the MOS transistor 16 is connected to the terminal 106 via the wire 63. A gate of the MOS transistor 15 is connected to the terminal 107, and a gate of the MOS transistor 16 is connected to the terminal 108. The snubber circuit 201 is connected between the wire 71 and the terminal 109. The snubber circuit 202 connected between the wire 62 and the terminal 109.

A power circuit that supplies a preliminary current and a light emission current can be connected to the terminals 105 and 106 of the light emission device 1 in the drawing. Specifically, the terminal 105 can be connected to the power line Vdd, and the terminal 106 can be connected to the constant current source 20 described with reference to FIG. 3. Furthermore, the drawing illustrates a control unit 2 that generates a control signal for controlling the light emission device 1. The control unit 2 can generate ON signals of the MOS transistors 15 and 16, and supply the ON signals as control signals. The terminals 107 and 108 are connected to the control unit 2, and control signals corresponding to the MOS transistors 15 and 16 are respectively supplied. Furthermore, the terminal 109 can be connected to a low-impedance node. Specifically, the terminal 109 can be grounded.

In this manner, by mounting the light emission chip 110 and semiconductor elements on one package, the light emission device 1 can be downsized.

Note that the configuration of the light emission device 1 is not limited to this example. For example, a configuration in which the control unit 2 is mounted on one package together with the light emission chip 110 can also be employed.

Note that, in the above-described first to sixth embodiments, a configuration in which the light emission device 1 includes the control unit 2 can also be employed.

Because the configuration of the light emission device 1 other than this is similar to the configuration of the light emission device 1 that has been described in the second embodiment of the present disclosure, the description will be omitted.

As described above, the light emission device 1 according to the seventh embodiment of the present disclosure can downsize the light emission device 1 by mounting the light emission chip 110 and the semiconductor elements on one package.

8. Application Example to Camera

The technology according to the present disclosure (present technology) can be applied to various products. For example, the present technology may be implemented as a light emission device mounted on an imaging device such as a camera.

Figure 19:
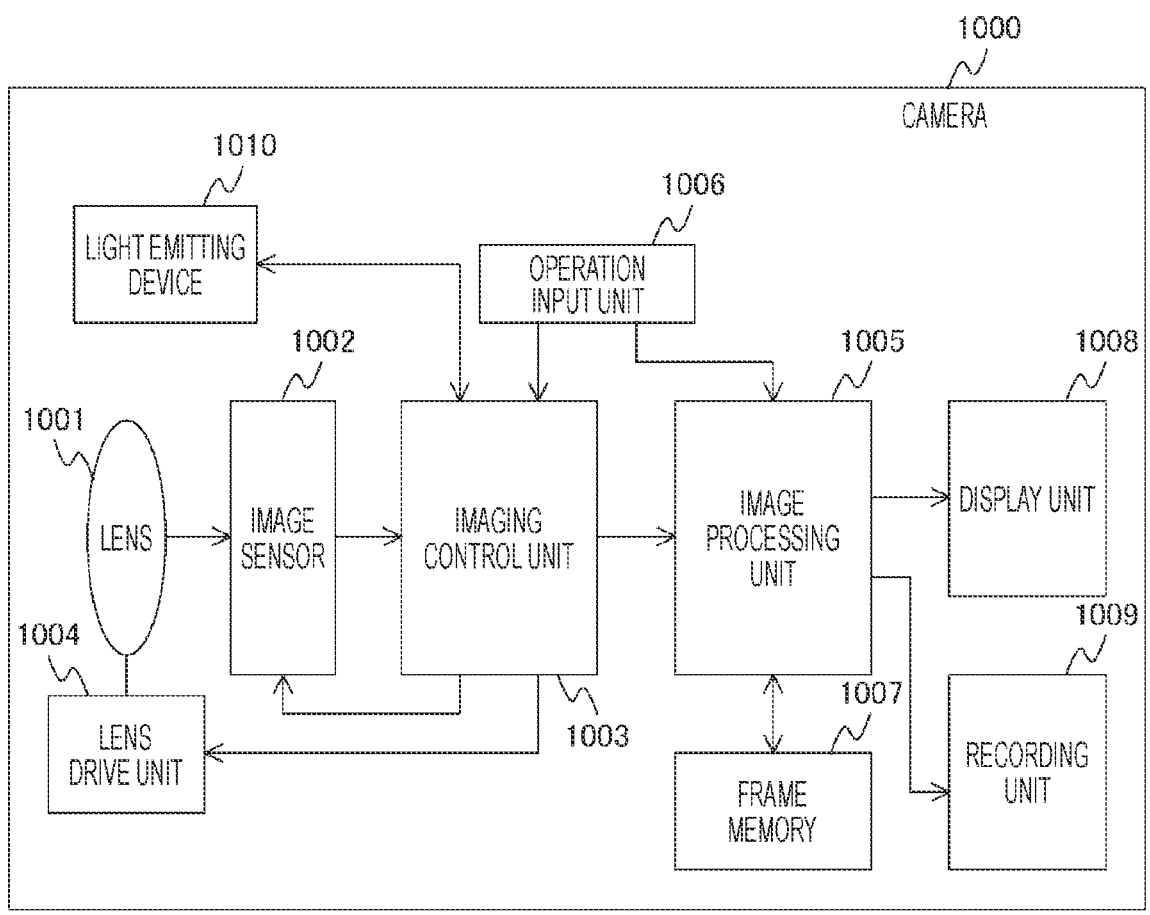
FIG. 19 a block diagram illustrating a schematic configuration example of a camera serving as an example of an imaging device to which the present technology can be applied.

FIG. 19 a block diagram illustrating a schematic configuration example of a camera serving as an example of an imaging device to which the present technology can be applied. A camera 1000 in the drawing includes a lens 1001, an image sensor 1002, an imaging control unit 1003, a lens drive an it 1004, an image processing unit 1005, an operation input unit 1006, a frame memory 1007, a display unit 1008, a recording unit 1009, and a light emission device 1010.

The lens 1001 is an image capturing lens of the camera 1000. The lens 1001 condenses light from a subject to enter the image sensor 1002, which will be described below, and forms an image of the subject.

The image sensor 1002 is a semiconductor element that captures an image on the basis of light from the subject condensed by the lens 1001. The image sensor 1002 generates an analog image signal corresponding to emitted light, converts the analog image signal into a digital image signal, and outputs the digital image signal.

The imaging control unit 1003 controls image capturing in the image sensor 1002. The imaging control unit 1003 controls the image sensor 1002 by generating a control signal and outputting the control signal to the image sensor 1002. Furthermore, the imaging control unit 1003 can perform autofocusing in the camera 1000 on the basis of an image signal output from the image sensor 1002. Here, the autofocusing is a system for detecting a focal position of the lens 1001, and automatically adjusting the focal position. As the autofocusing, a method of detecting a focal position by detecting an image plane phase difference on the basis of phase difference pixels arranged in the image sensor 1002 (image plane phase difference autofocusing) can be used. Furthermore, a method of detecting a position at which image contrast becomes the highest, as a focal position (contrast autofocusing) can also be applied. The imaging control unit 1003 performs autofocusing by adjusting the position of the lens 1001 via the lens drive unit 1004 on the basis of the detected focal position. Note that the imaging control unit 1003 can be formed by, for example, a digital signal processor (DSP) provided with firmware.

The lens drive unit 1004 drives the lens 1001 on the basis of the control of the imaging control unit 1003. The lens drive unit 1004 can drive the lens 1001 by changing the position of the lens 1001 using a built-in motor.

The image processing unit 1005 processes an image signal generated by the image sensor 1002. Examples of the processing include demosaic for generating an image signal of a deficient color among image signals corresponding to red, green, and blue for each pixel, noise reduction for removing noise of an image signal, encoding of an image signal, and the like. The image processing unit 1005 can be formed by, for example, a microcomputer provided with firmware.

The operation input unit 1006 receives an operation input from a user of the camera 1000. For example, a press button or a touch panel can be used as the operation input unit 1006. An operation input received by the operation input unit 1006 is transmitted to the imaging control unit 1003 and the image processing unit 1005. Thereafter, processing corresponding to the operation input such as, for example, image capturing processing of a subject is activated.

The frame memory 1007 is a memory that stores a frame being an image signal corresponding to one screen. The frame memory 1007 is controlled by the image processing unit 1005, and holds a frame in the process of image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disc can be used as the recording unit 1009.

The light emission device 1010 emits laser light for measuring a distance to a subject. Furthermore, the above-described imaging control unit 1003 further performs control of the light emission device 1010 and measurement of a distance to a subject. The measurement of a distance to a subject in the camera 1000 can be performed in the following manner. First of all, the imaging control unit 1003 controls the light emission device 1010 to emit laser light. Next, laser light reflected by a subject is detected by the image sensor 1002. Next, the imaging control unit 1003 measures a time from when laser light is emitted from the light emission device 1010, to when laser light is detected by the image sensor 1002, and calculates a distance to the subject.

Heretofore, a camera to which the present invention can be applied has been described. Among the configurations described above, the present technology can be applied to the light emission device 1010. Specifically, the light emission device 1 described with reference to FIG. 1 can be applied to the light emission device 1010. If the light emission device 1 is applied to the light emission device 1010, high-speed emission of laser light can be performed.

Note that, here, a camera has been described as an example, but the present technology may be applied to other devices such as a mobile terminal or an unmanned carrier, for example.

Lastly, the above description of each embodiment is an example of the present disclosure, and the present disclosure is not limited to the above-described embodiments. Thus, it should be appreciated that various changes can be made in accordance with the design and the like without departing from the technical idea according to the present disclosure, aside from the above-described embodiments.

Furthermore, the drawings in the above-described embodiments are schematic diagrams, and ratios between dimension of components, and the like do not always correspond to the actual ratios. Furthermore, it should be appreciated that the drawings include parts having different relationships and ratios between dimensions.

Note that the present technology can also employ the following configurations.

(1) A light emission drive circuit including:
a light emission current wire configured to flow a light emission current for causing a light emitting element to emit light, in the light emitting element;
a light emission current switch that is connected to the light emission current wire, and is configured to control the light emission current;
a preliminary current wire configured to flow, in the light emission current wire, a preliminary current for exciting an inductance component of the light emission current wire before a light emission period being a period in which the light emission current flows in the light emitting element; and
a preliminary current switch that is connected to the preliminary current wire, and is configured to control the preliminary current.

(2) The light emission drive circuit according to (1) described above,
in which the light emitting element includes
a light emission chip that includes two electrodes arranged therein, and is configured to emit light in accordance with the light emission current flowing between the electrodes,
two light emission current terminals for flowing the light emission current that are respectively arranged for the two electrodes, and a preliminary current terminal for flowing the preliminary current that is arranged on at least one of the two electrodes,
the light emission current wire is connected to the light emission current terminal, and
the preliminary current wire is connected to the preliminary current terminal.

(3) The light emission drive circuit according to (1) or (2)described above, further including a bias circuit configured to supply a current substantially equal to a light emission threshold of the light emitting element, to the light emitting element as a bias current.

(4) The light emission drive circuit according to any of (1) to (3) described above, in which the light emission current is changed during the light emission period.

(5) The light emission drive circuit according to according to (4) described above, in which the light emission current is decreased during the light emission period.

(6) The light emission drive circuit according to according to any of (1) to (5) described above, in which the light emitting element includes a laser diode.

(7) The light emission drive circuit according to according to any of (1) to (6) described above, further including a power circuit configured to supply the light emission current.

(8) The light emission drive circuit according to according to (7) described above, in which the power circuit further supplies the preliminary current.

(9) The light emission drive circuit according to according to (7) described above, further including a power circuit configured to supply the preliminary current.

(10) The light emission drive circuit according to according to any of (1) to (9) described above, further including a control unit configured to generate control signals of the light emission current switch and the preliminary current switch.

(11) The light emission drive circuit according to according to any of (1) to (10) described above, in which the light emission current switch and the preliminary current switch are formed by MOS transistors.

(12) The light emission drive circuit according to according to any of (1) to (11) described above, in which a snubber circuit is connected to at least one of the light emission current wire or the preliminary current wire.

(13) A light emission device including:
a light emitting element;
a light emission current wire configured to flow a light emission current for causing the light emitting element to emit light, in the light emitting element;
a light emission current switch that is connected to the light emission current wire, and is configured to control the light emission current;
a preliminary current wire configured to flow, in the light emission current wire, a preliminary current for exciting an inductance component of the light emission current wire before a light emission period being a period in which the light emission current flows in the light emitting element; and
a preliminary current switch that is connected to the preliminary current wire, and is configured to control the preliminary current.

REFERENCE SIGNS LIST

1 Light emission device
2 Control unit
11 Preliminary current switch 12 Light emission current switch
13, 14 Switch
15, 16 MOS transistor
20, 21 Constant current source
41 to 45 Resistor
51 to 52 Capacitor
61 to 65, 71 to 74, 171 to 172 Wire
100, 170, 180, 190 Light emitting element
101 to 108 Terminal
110 Light emission chip
111 Semiconductor region
112 Anode electrode
113 Cathode electrode
114 VCSEL
120, 121 Bonding wire
140 Substrate
141 to 143 Pad
201 to 202 Snubber circuit
1000 Camera
1010 Light emission device

The invention claimed is:

1. A light emission drive circuit comprising:
a light emission current wire configured to flow a light emission current for causing a light emitting element to emit light, in the light emitting element;
a light emission current switch that is connected to the light emission current wire, and is configured to control the light emission current;
a preliminary current wire configured to flow, in the light emission current wire, a preliminary current for exciting an inductance component of the light emission current wire before a light emission period being a period in which the light emission current flows in the light emitting element;
a preliminary current switch that is connected to the preliminary current wire, and is configured to control the preliminary current; and
a bias circuit configured to supply a current substantially equal to a light emission threshold of the light emitting element, to the light emitting element as a bias current,
wherein the light emitting element includes
a light emission chip that includes two electrodes arranged therein, and is configured to emit light in accordance with the light emission current flowing between the two electrodes,
two light emission current terminals for flowing the light emission current that are respectively arranged for the two electrodes, and
a preliminary current terminal for flowing the preliminary current that is arranged on at least one of the two electrodes, and wherein
the light emission current wire is connected to at least one of the two light emission current terminals, and
the preliminary current wire is connected to the preliminary current terminal.

2. The light emission drive circuit according to claim 1, wherein the light emission current is changed during the light emission period.

3. The light emission drive circuit according to claim 2, wherein the light emission current is decreased during the light emission period.

4. The light emission drive circuit according to claim 1, wherein the light emitting element includes a laser diode.

5. The light emission drive circuit according to claim 1, further comprising a power circuit configured to supply the light emission current.

6. The light emission drive circuit according to claim 5, wherein the power circuit further supplies the preliminary current.

7. The light emission drive circuit according to claim 5, further comprising a power circuit configured to supply the preliminary current.

8. The light emission drive circuit according to claim 1, further comprising a control unit configured to generate control signals of the light emission current switch and the preliminary current switch.

9. The light emission drive circuit according to claim 1, wherein the light emission current switch and the preliminary current switch are formed by MOS transistors.

10. A light emission drive circuit comprising:
a light emission current wire configured to flow a light emission current for causing a light emitting element to emit light, in the light emitting element;
a light emission current switch that is connected to the light emission current wire, and is configured to control the light emission current;
a preliminary current wire configured to flow, in the light emission current wire, a preliminary current for exciting an inductance component of the light emission current wire before a light emission period being a period in which the light emission current flows in the light emitting element;
a preliminary current switch that is connected to the preliminary current wire, and is configured to control the preliminary current; and
a bias circuit configured to supply a current substantially equal to a light emission threshold of the light emitting element, to the light emitting element as a bias current,
wherein a snubber circuit is connected to at least one of the light emission current wire or the preliminary current wire.

11. A light emission device comprising:
a light emitting element;
a light emission current wire configured to flow a light emission current for causing the light emitting element to emit light, in the light emitting element;
a light emission current switch that is connected to the light emission current wire, and is configured to control the light emission current;
a preliminary current wire configured to flow, in the light emission current wire, a preliminary current for exciting an inductance component of the light emission current wire before a light emission period being a period in which the light emission current flows in the light emitting element;
a preliminary current switch that is connected to the preliminary current wire, and is configured to control the preliminary current; and
a bias circuit configured to supply a current substantially equal to a light emission threshold of the light emitting element, to the light emitting element as a bias current,
wherein the light emitting element includes
a light emission chip that includes two electrodes arranged therein, and is configured to emit light in accordance with the light emission current flowing between the two electrodes,
two light emission current terminals for flowing the light emission current that are respectively arranged for the two electrodes, and
a preliminary current terminal for flowing the preliminary current that is arranged on at least one of the two electrodes, and wherein the light emission current wire is connected to at least one of the two light emission current terminals, and the preliminary current wire is connected to the preliminary current terminal.

12. The light emission device according to claim 11, wherein the light emission current is changed during the light emission period.

13. The light emission device according to claim 12, wherein the light emission current is decreased during the light emission period.

14. The light emission device according to claim 11, wherein the light emitting element includes a laser diode.

15. The light emission device according to claim 11, further comprising a power circuit configured to supply the light emission current.

16. The light emission device according to claim 15, wherein the power circuit further supplies the preliminary current.

17. The light emission device according to claim 15, further comprising a power circuit configured to supply the preliminary current.

18. The light emission device according to claim 11, further comprising a control unit configured to generate control signals of the light emission current switch and the preliminary current switch.

* * * * *